US012601972B2

(12) United States Patent
Kubodera et al.

(10) Patent No.: US 12,601,972 B2
(45) Date of Patent: Apr. 14, 2026

(54) RESIST UNDERLAYER FILM-FORMING COMPOSITION WITH SUPPRESSED DEGENERATION OF CROSSLINKING AGENT

(71) Applicant: NISSAN CHEMICAL CORPORATION, Tokyo (JP)

(72) Inventors: Shun Kubodera, Toyama (JP); Satoshi Kamibayashi, Toyama (JP); Yuki Endo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 725 days.

(21) Appl. No.: 17/911,844

(22) PCT Filed: Mar. 30, 2021

(86) PCT No.: PCT/JP2021/013434

§ 371 (c)(1),
(2) Date: Sep. 15, 2022

(87) PCT Pub. No.: WO2021/200883

PCT Pub. Date: Oct. 7, 2021

(65) Prior Publication Data

US 2023/0131253 A1 Apr. 27, 2023

(30) Foreign Application Priority Data

Mar. 31, 2020 (JP) ................................ 2020-063067

(51) Int. Cl.

| | |
|---|---|
| ***G03F 7/11*** | (2006.01) |
| ***C09D 133/14*** | (2006.01) |
| ***C09D 163/04*** | (2006.01) |
| ***H01L 21/027*** | (2006.01) |
| ***H01L 21/311*** | (2006.01) |
| ***H10P 50/00*** | (2026.01) |
| ***H10P 76/20*** | (2026.01) |

(52) U.S. Cl.

CPC .............. *G03F 7/11* (2013.01); *C09D 133/14* (2013.01); *C09D 163/04* (2013.01); *H10P 50/73* (2026.01); *H10P 76/202* (2026.01)

(58) Field of Classification Search

CPC . G03F 7/11; G03F 7/091; G03F 7/094; G03F 7/004; C09D 133/14; C09D 163/04; H01L 21/0272; H01L 21/31144; H01L 21/0274; H01L 21/0337; C08G 59/687

USPC .......................................... 438/703; 430/311

See application file for complete search history.

(56) References Cited

U.S. PATENT DOCUMENTS

| | | | |
|---|---|---|---|
| 2006/0068335 | A1 | 3/2006 | Coley et al. |
| 2015/0212414 | A1 | 7/2015 | Pohlers et al. |
| 2015/0378260 | A1 | 12/2015 | Endo et al. |
| 2016/0005641 | A1 | 1/2016 | Sim et al. |
| 2016/0139509 | A1 | 5/2016 | Hashimoto et al. |
| 2017/0283651 | A1 | 10/2017 | Sim et al. |
| 2017/0336709 | A1 | 11/2017 | Lee et al. |
| 2019/0085173 | A1 | 3/2019 | Lee et al. |
| 2019/0129306 | A1 | 5/2019 | Jo et al. |

FOREIGN PATENT DOCUMENTS

| | | | |
|---|---|---|---|
| CN | 105324720 | A | 2/2016 |
| JP | 2006-301145 | A | 11/2006 |
| JP | 4945091 | B2 | 6/2012 |
| JP | 2016-28416 | A | 2/2016 |
| JP | 2017-187764 | A | 10/2017 |
| JP | 6256719 | B2 | 1/2018 |
| JP | 6334900 | B2 | 5/2018 |
| JP | 2019-08281 | A | 1/2019 |
| JP | 6453378 | B2 | 1/2019 |
| JP | 2019-56903 | A | 4/2019 |
| JP | 2019-082681 | A | 5/2019 |
| WO | 2014/129582 | A1 | 8/2014 |
| WO | 2016/190368 | A1 | 12/2016 |

OTHER PUBLICATIONS

Jun. 29, 2021 Search Report issued in International Patent Application No. PCT/JP2021/013434.

Sep. 29, 2022 International Preliminary Report on Patentability issued in International Patent Application No. PCT/JP2021/013434.

Jan. 21, 2025 Office Action issed in Japanese Patent Application No. 2022-512254.

Jan. 31, 2026 Office Action issued in Chinese Patent Application No. 202180026798.5.

*Primary Examiner* — Caleen O Sullivan

(74) *Attorney, Agent, or Firm* — OLIFF PLC

(57) ABSTRACT

A resist underlayer film forming composition which has high storage stability, has a low film curing start temperature, can cause the generation of a sublimated product in a reduced amount, and enables the formation of a film that is rarely eluted into a photoresist solvent; a method for forming a resist pattern using the resist underlayer film forming composition; and a method for manufacturing a semiconductor device. The resist underlayer film forming composition includes a crosslinkable resin, a crosslinking agent, a crosslinking catalyst represented by formula (I) and a solvent. $(A\text{-}SO_3)^-(BH)^+$[wherein A represents a linear, branched or cyclic saturated or unsaturated aliphatic hydrocarbon group which may be substituted, an aryl group which may be substituted by a group other than a hydroxy group, or a heteroaryl group which may be substituted; and B represents a base having a pKa value of 6.5 to 9.5.]

19 Claims, No Drawings

RESIST UNDERLAYER FILM-FORMING COMPOSITION WITH SUPPRESSED DEGENERATION OF CROSSLINKING AGENT

TECHNICAL FIELD

The present invention relates to a resist underlayer film-forming composition, in which degeneration of the crosslinking agent is suppressed, a resist pattern forming method using the resist underlayer film-forming composition, and a method for producing a semiconductor device.

BACKGROUND ART

In recent lithography processes for semiconductor device production, semiconductor process materials, including resist underlayer films (BARCs), have been increasingly required to be of higher quality. Recently, degeneration of crosslinking agents and polymer resins, which are major components of resist underlayer films, by crosslinking catalysts and solvents used in resist underlayer film-forming compositions has become a new problem, and new crosslinking catalysts that suppress such degeneration are required.

Patent Literature 1 discloses an ionic thermal acid generator represented by the formula $(A^-)(BH)^+$, where $A^-$ is an organic or inorganic acid anion having a pKa of 3 or less, and $(BH)^+$ is a monoprotonated form of nitrogen-containing base B having a pKa of 0 to 5.0 and a boiling point lower than 170° C. Specifically, the combinations of perfluorobutane sulfonate with ammonium, pyridinium, 3-fluoropyridinium, or pyridazinium are disclosed.

Patent Literature 2 discloses a thermal acid generator represented by the formula $X^-YH^+$, where X is an anionic component and Y is a substituted pyridine. Specifically, the combination of methylbenzenesulfonate with fluoropyridinium or trifluoromethylpyridinium is disclosed.

Patent Literature 3 discloses a thermal acid generator containing a sulfonic acid component without a hydroxyl group and a pyridinium component with a ring substitution group. Specifically, the combination of methylbenzenesulfonate with methylpyridinium, methoxypyridinium, or trimethylpyridinium is disclosed.

Patent Literature 4 discloses a thermal acid generator containing a triethylamine salt of paratoluenesulfonic acid, ammonia salt of paratoluenesulfonic acid, ammonia salt of mesitylene sulfonic acid, ammonia salt of dodecylbenzenesulfonic acid, or dimethylamine salt of paratoluenesulfonic acid.

Patent Literature 5 discloses a thermal acid generator containing various sulfonic acids and $NH_4^+$ or primary, secondary, tertiary, or quaternary ammonium ions.

CITATION LIST

Patent Literature

Patent Literature 1: Japanese Patent No. 6334900
Patent Literature 2: JP 2019-56903 A
Patent Literature 3: Japanese Patent No. 6453378
Patent Literature 4: Japanese Patent No. 4945091
Patent Literature 5: Japanese Patent No. 6256719

SUMMARY OF INVENTION

Technical Problem

However, the thermal acid generators disclosed in the prior art were found to have the following problems; they promote the reaction between aminoplast crosslinking agents and compounds with alcoholic hydroxyl groups such as propylene glycol monomethyl ether and methyl 2-hydroxy-2-methylpropionate, which are frequently used as solvents in resist underlayer film-forming compositions, and easily degenerate the former. Another problem found was that the use of a base with a high boiling point or a strong base as a thermal acid generator decreased the curability of the underlying film, resulting in an increase in the amount of sublimates generated.

Therefore, an object of the present invention is to provide a resist underlayer film-forming composition capable of forming a film with high storage stability, low curing start temperature of the film, low amount of sublimates generated, and no leaching in photoresist solvents; a resist pattern forming method using the resist underlayer film-forming composition; and a method for producing a semiconductor device.

Solution to Problem

The present invention embraces the followings.

[1] A resist underlayer film-forming composition including a crosslinkable resin, a crosslinking agent, a crosslinking catalyst represented by the following formula (I), and a solvent:

[Chemical Formula 1]

$$(A\text{-}SO_3)^-(BH)^+ \quad (I)$$

wherein A is a linear, branched, or cyclic saturated or unsaturated aliphatic hydrocarbon group which may be substituted, an aryl group which may be substituted with one or more groups other than hydroxy group, or a heteroaryl group which may be substituted, and B is a base having a pKa of 6.5 to 9.5.

[2] A resist underlayer film-forming composition including an epoxy group-containing compound and/or an epoxy group-containing resin, a crosslinking catalyst represented by the following formula (I), and a solvent:

[Chemical Formula 2]

$$(A\text{-}SO_3)^-(BH)^+ \quad (I)$$

wherein A is a linear, branched, or cyclic saturated or unsaturated aliphatic hydrocarbon group which may be substituted, an aryl group which may be substituted with one or more groups other than hydroxy group, or a heteroaryl group which may be substituted, and B is a base having a pKa of 6.5 to 9.5.

[3] The resist underlayer film-forming composition according to [1], in which the crosslinking agent is an aminoplast crosslinking agent or a phenoplast crosslinking agent.

[4] The resist underlayer film-forming composition according to any one of [1] to [3], wherein in formula (I), B is $R^1R^2R^3N$, where $R^1$ and $R^2$ each independently represent a linear or branched, saturated or unsaturated aliphatic hydrocarbon group which may be substituted, $R^1$ and $R^2$ may form a ring with or without a heteroatom, $R^3$ represents an aromatic group which may be substituted, or a linear or branched, saturated or unsaturated aliphatic hydrocarbon group which may be substituted, and when $R^1$ and $R^2$ do not form a ring, $R^3$ is an aromatic group which may be substituted.

[5] The resist underlayer film-forming composition according to any one of [1] to [4], wherein B in formula (I) is a base represented by the following formula:

[Chemical Formula 3]

$R^1R^2R^3N$ wherein $R^1$ and $R^2$ each independently represent a linear or branched, saturated or unsaturated aliphatic hydrocarbon group which may be substituted, and $R^3$ represents an aromatic group which may be substituted, or the following formula (II):

[Chemical Formula 4]

(II)

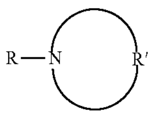

wherein R is a hydrogen atom, a nitro group, a cyano group, an amino group, a carboxyl group, a halogen atom, an alkoxy group having 1 to 10 carbon atoms, an alkyl group having 1 to 10 carbon atoms, an alkenyl group having 2 to 10 carbon atoms, an aryl group having 6 to 40 carbon atoms, an organic group containing an ether bond, an organic group containing a ketone bond, an organic group containing an ester bond, or a combination thereof, R' is represented by

[Chemical Formula 5]

$—(R^a)_n—X—(R^b)_m—$ where $R^a$ and $R^b$ each independently represent an optionally substituted alkyl, X is O, S, or $SO_2$, and n, and m are each independently 2, 3, 4, 5, or 6.

[6] The resist underlayer film-forming composition according to [5], wherein $R^3$ in the preceding formula represents a phenyl, naphthyl, anthracenyl, or phenanthrenyl group which may be substituted, R in formula (II) is a hydrogen atom, a methyl group, an ethyl group, an allyl group, or a cyanomethyl group, and R' in formula (II) is a base represented by

[Chemical Formula 6]

$—(CH_2)_n—O—(CH_2)_m—$

[7] The resist underlayer film-forming composition according to any one of [1] to [6], further comprising an alcoholic hydroxy group-containing compound or a compound containing a group capable of forming one or more alcoholic hydroxy groups.

[8] The resist underlayer film-forming composition according to [7], wherein the alcoholic hydroxy group-containing compound or a compound containing a group capable of forming one or more alcoholic hydroxy groups is a propylene glycol-based solvent, an oxyisobutyric acid ester-based solvent, or a butylene glycol-based solvent.

[9] The resist underlayer film-forming composition according to [7] or [8], wherein the alcoholic hydroxy group-containing compound or a compound containing a group capable of forming one or more alcoholic hydroxy groups is propylene glycol monomethyl ether or methyl 2-hydroxy-2-methylpropionate.

[10] The resist underlayer film-forming composition according to any one of [1] to [9], wherein A in formula (I) is a methyl group, a fluoromethyl group, or a tolyl group.

[11] The resist underlayer film-forming composition according to any one of [1] to [10], wherein B in formula (I) is N-methylmorpholine or N,N-diethylaniline.

[12] The resist underlayer film-forming composition according to any one of [3] to [11], wherein the aminoplast crosslinking agent is a highly alkylated, alkoxylated, or alkoxyalkylated melamine, benzoguanamine, glycol urea, urea, or a polymer thereof.

[13] The resist underlayer film-forming composition according to any one of [3] to [11], wherein the phenoplast crosslinking agent is a highly alkylated, alkoxylated, or alkoxyalkylated aromatic, or a polymer thereof.

[14] The resist underlayer film-forming composition according to any one of [1] and [3] to [13], wherein the crosslinkable resin is at least one member selected from the group consisting of novolac resins, polyester resins, polyimide resins, and acrylic resins.

[15] The resist underlayer film-forming composition according to any one of [1] to [14], further comprising a surfactant.

[16] A resist underlayer film obtained by applying the resist underlayer film-forming composition according to any one of [1] to [15] to a semiconductor substrate, followed by baking.

[17] A method for forming a resist pattern for use in the production of semiconductors, comprising the step of applying the resist underlayer film-forming composition according to any one of [1] to [15] to a semiconductor substrate, followed by baking to form a resist underlayer film.

[18] A method for producing a semiconductor device, comprising the steps of:

forming a resist underlayer film on a semiconductor substrate using the resist underlayer film-forming composition according to any one of [1] to [15], forming a resist film thereon, forming a resist pattern by irradiation with a light or electron beam followed by development, etching the resist underlayer film using the formed resist pattern, and processing the semiconductor substrate using the patterned resist underlayer film.

[19] A method for producing a semiconductor device, comprising the steps of:

forming a resist underlayer film on a semiconductor substrate using the resist underlayer film-forming composition according to any one of [1] to [15], forming a hard mask thereon, forming a resist film thereon, forming a resist pattern by irradiation with a light or electron beam followed by development, etching the hard mask using the formed resist pattern, etching the resist underlayer film using the patterned hard mask, and processing the semiconductor substrate using the patterned resist underlayer film.

[20] The production method according to [19], wherein the hard mask is formed by application or vapor deposition of an inorganic substance.

Advantageous Effects of Invention

The present invention provides a resist underlayer film-forming composition, a resist pattern forming method using the resist underlayer film-forming composition, and a method for producing a semiconductor device, in which the resist underlayer film-forming composition has high storage stability, because the crosslinking catalyst in the composition inhibits side reactions of the aminoplast or phenoplast crosslinking agent (for example, reactions with solvents) suppresses the amount of sublimates generated, because it requires a relatively low curing start temperature of the resist underlayer film, and can form a film that does not leach into a photoresist solvent.

DESCRIPTION OF EMBODIMENTS

The resist underlayer film-forming composition of the present invention comprises a crosslinkable resin, a crosslinking agent, and a crosslinking catalyst represented by the following formula (I):

[Chemical Formula 7]

$$(A\text{-}SO_3)^-(BH)^+ \quad (I)$$

wherein A is a linear, branched, or cyclic saturated or unsaturated aliphatic hydrocarbon group which may be substituted, an aryl group which may be substituted with one or more groups other than hydroxy group, or a heteroaryl group which may be substituted, and B is a base having a pKa of 6.5 to 9.5.

[Crosslinkable Resin]

The crosslinkable resin in the present invention is an uncrosslinked or partially crosslinked resin, which is a resin that may be crosslinked by the action of a crosslinking catalyst to form a film that does not leach into a photoresist solvent. The crosslinkable resin is preferably at least one member selected from the group consisting of novolac resins, polyester resins, polyimide resins, and acrylic resins. Some specific examples (repeating unit structures) are listed below.

[Chemical Formula 8]

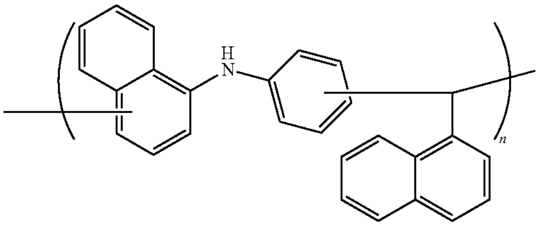
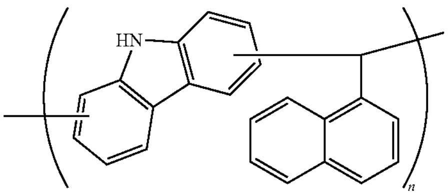
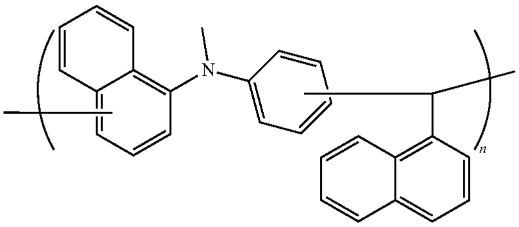
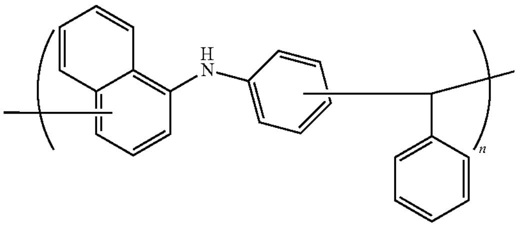
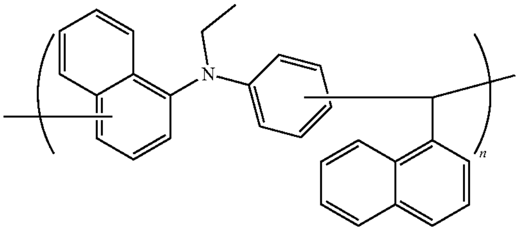
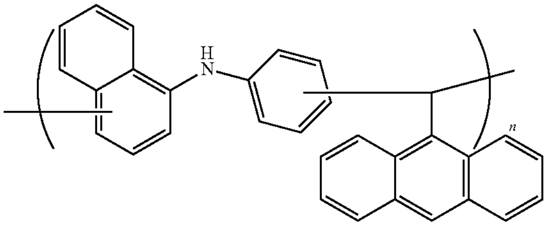
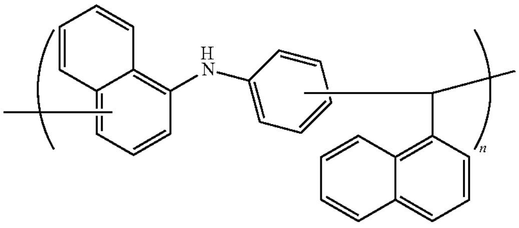
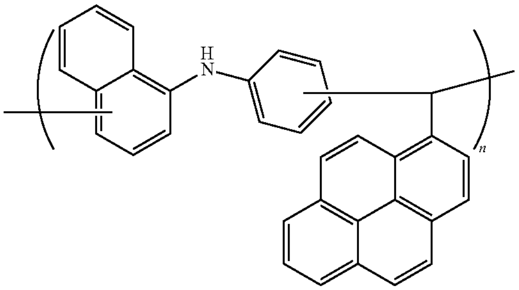

-continued
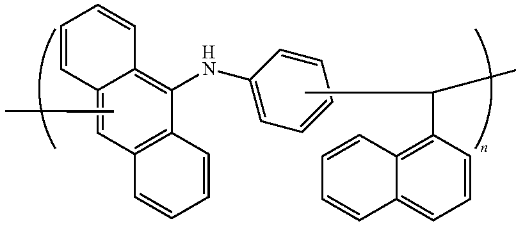
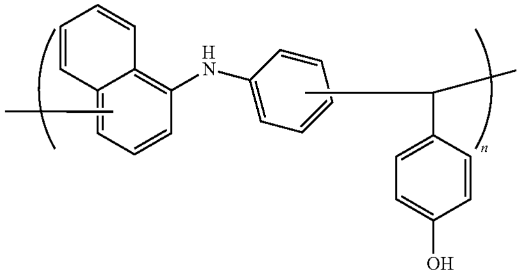
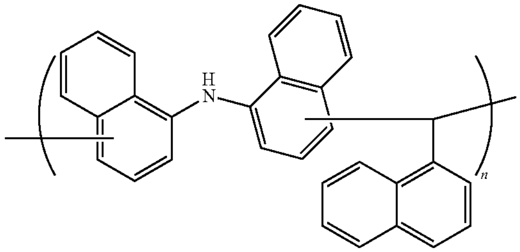
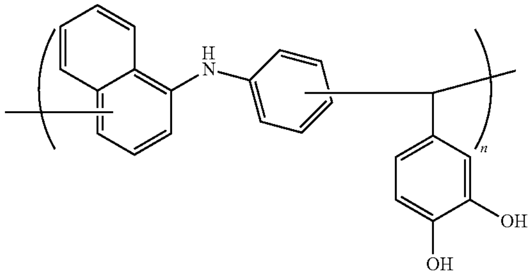
[Chemical Formula 9]
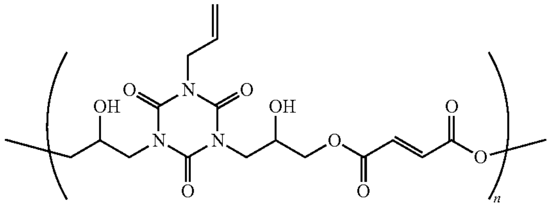
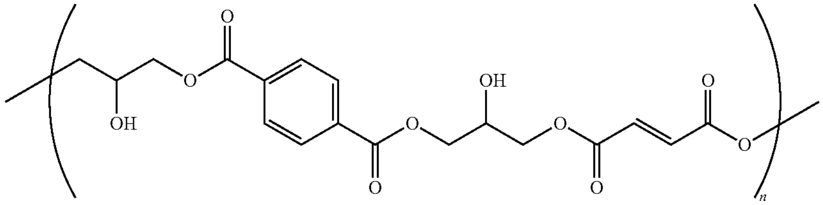
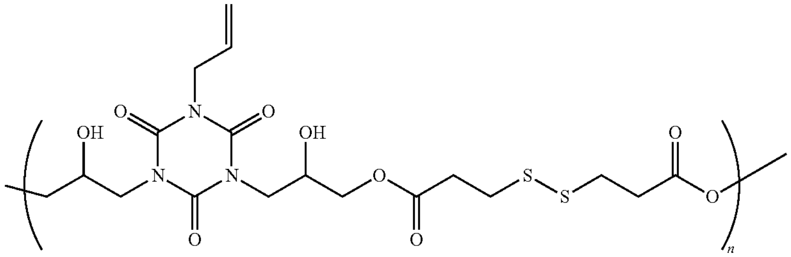
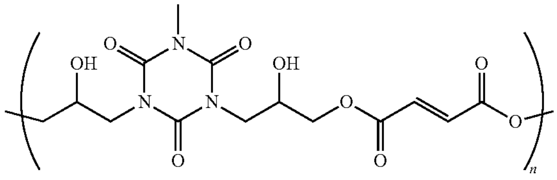
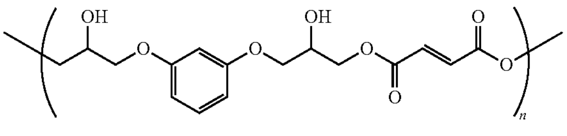
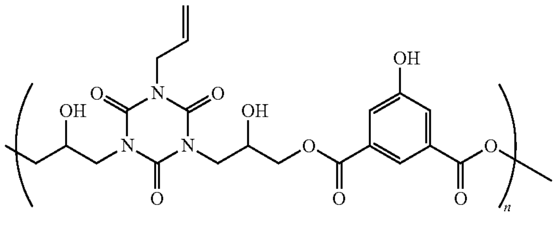
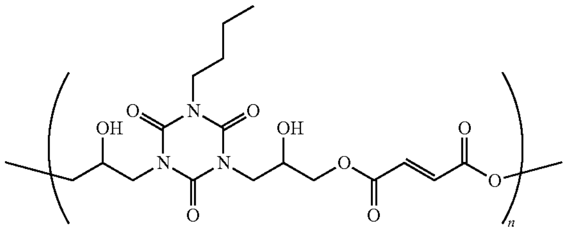

-continued
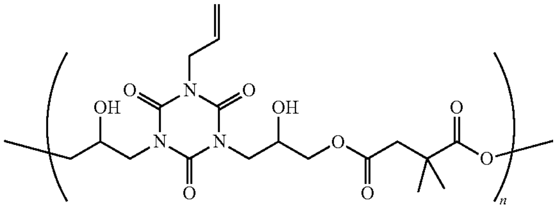
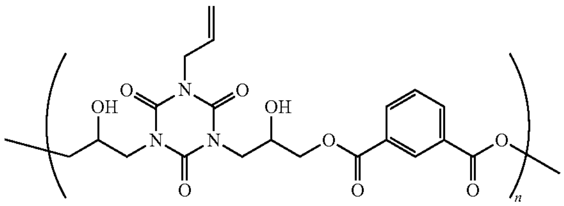
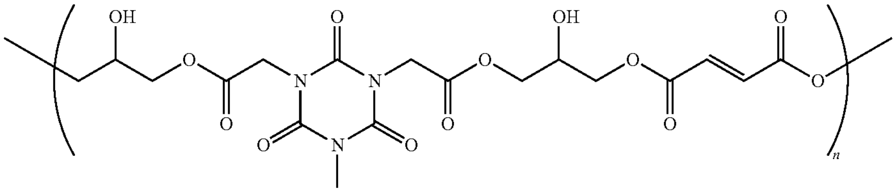
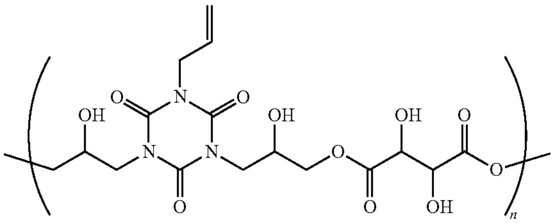
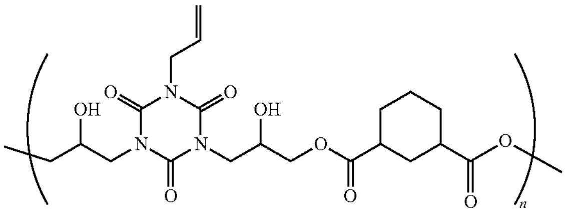
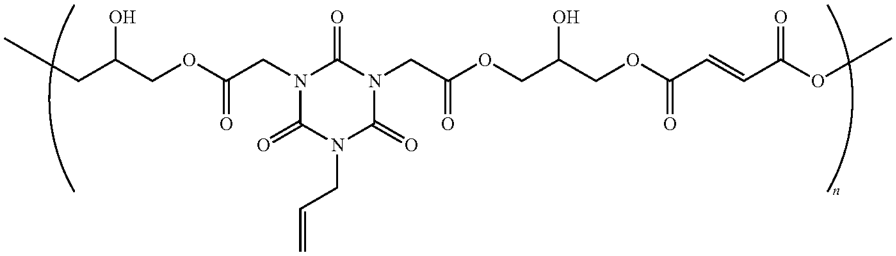
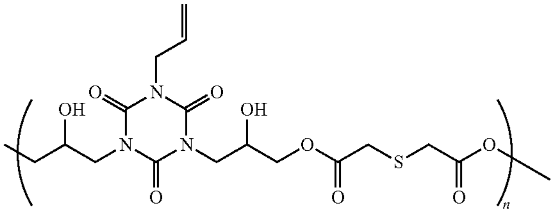
[Chemical Formula 10]
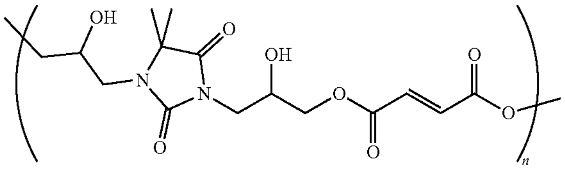
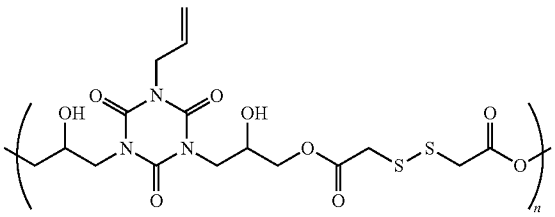
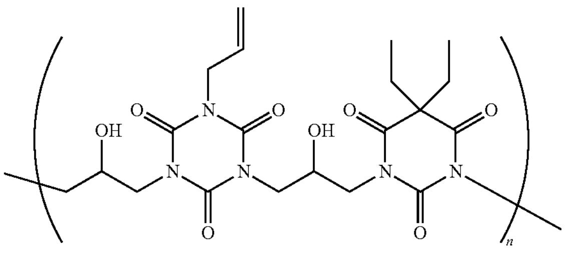

-continued
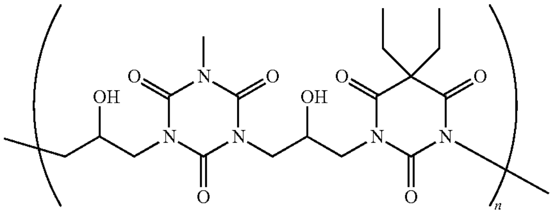
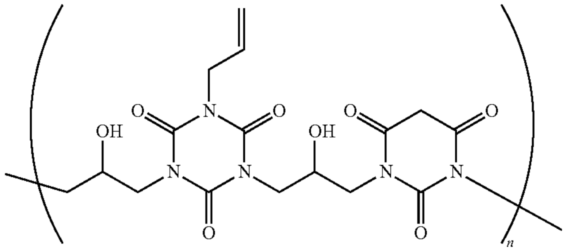
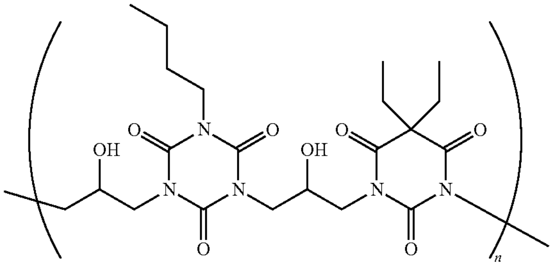
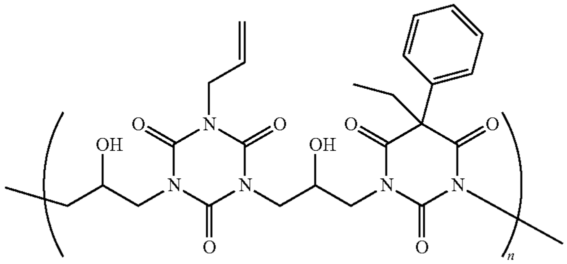
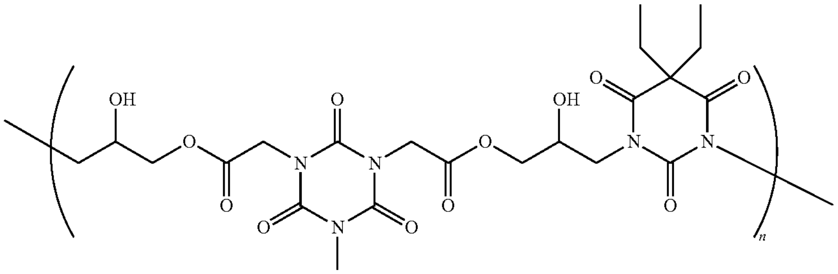
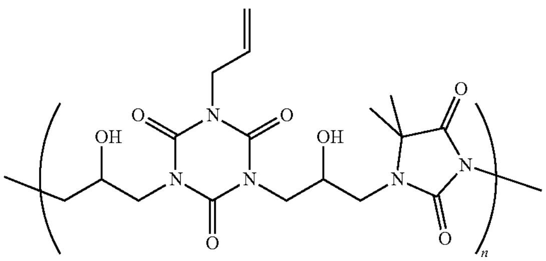
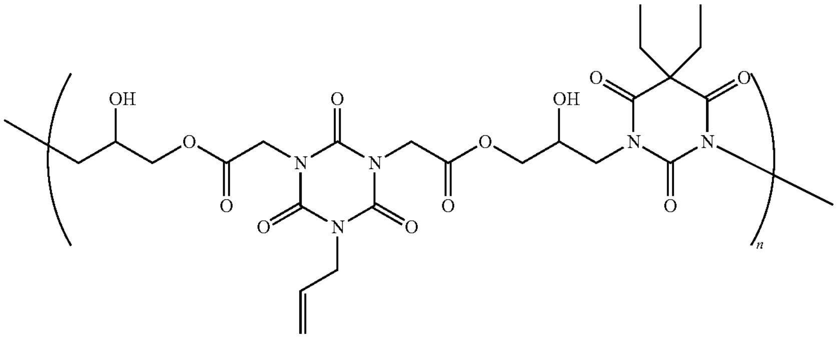
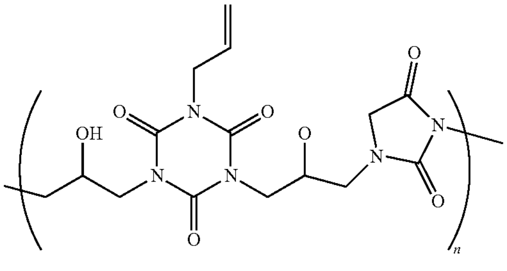
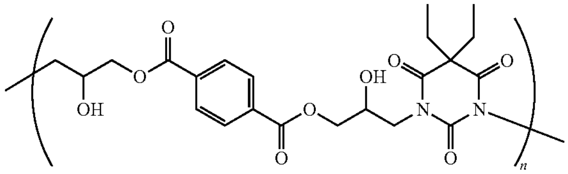

-continued
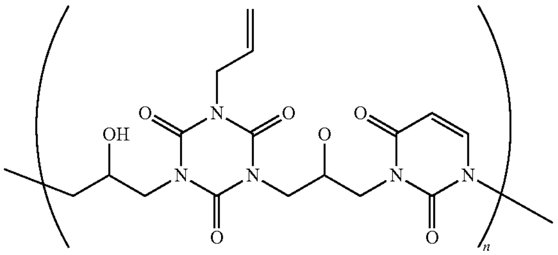
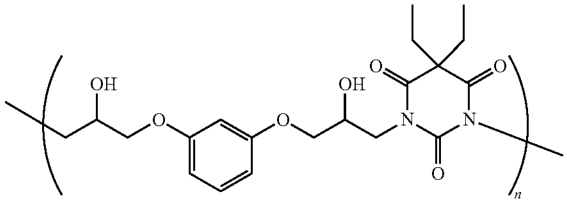
[Chemical Formula 11]
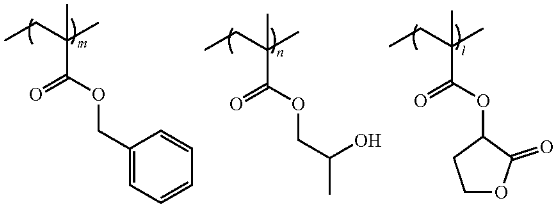
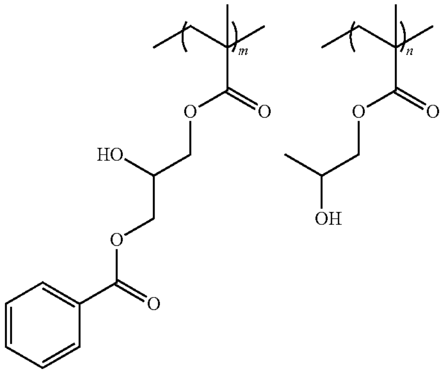
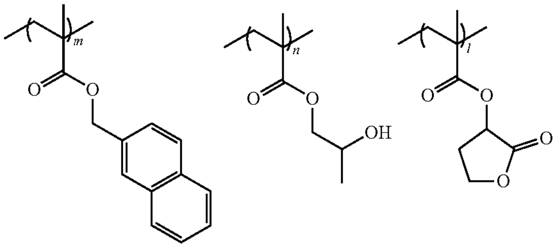
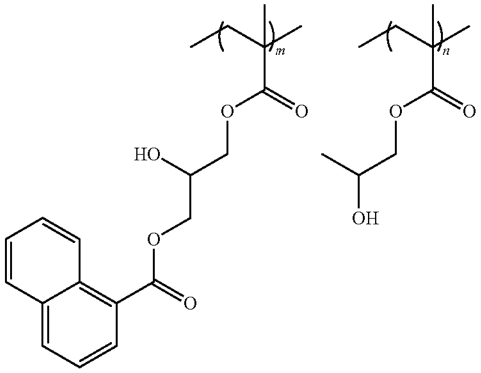
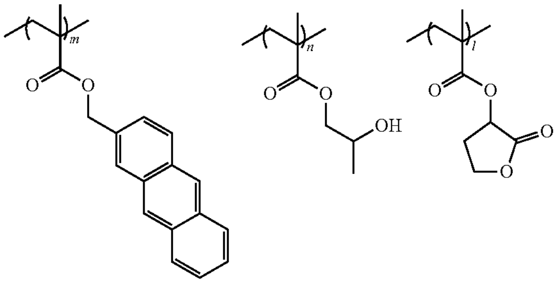
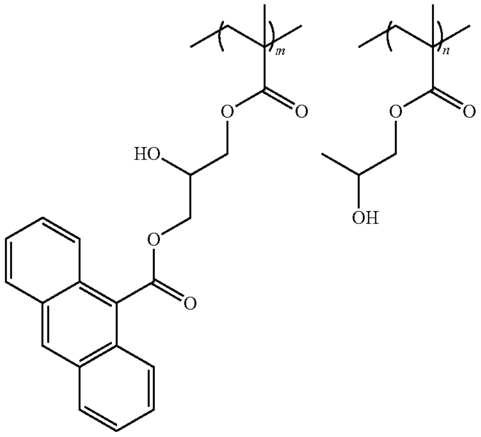

-continued

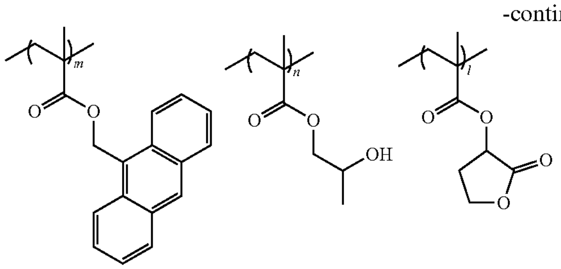

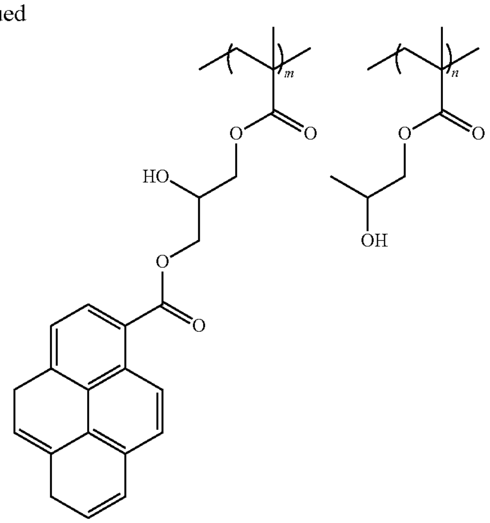

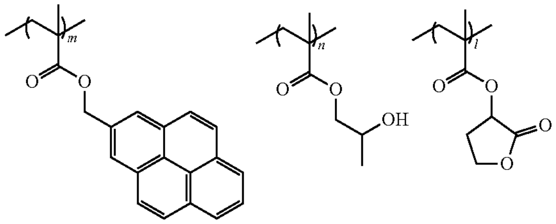

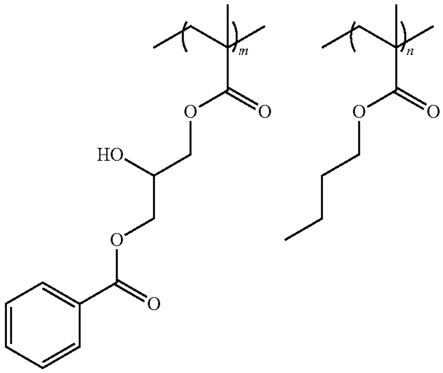

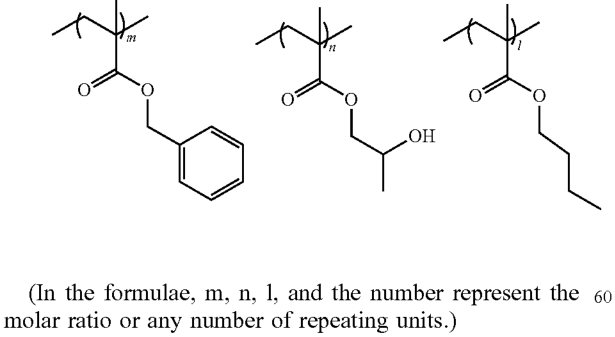

(In the formulae, m, n, l, and the number represent the molar ratio or any number of repeating units.)

Epoxy Group-Containing Compound and/or Epoxy Group-Containing Resin

The epoxy group-containing compound and the epoxy group-containing resin in the present invention are compounds and resins having one or more epoxy groups per molecule, which may be crosslinked or polymerized by the action of a crosslinking catalyst to form a film that does not leach into a photoresist solvent. The epoxy group-containing compound and the epoxy group-containing resin are preferably at least one member selected from the group consisting of glycidyl ether epoxy resins, glycidyl ester epoxy resins, and glycidylamine epoxy resins. Some specific examples are listed below.

[Chemical Formula 12]
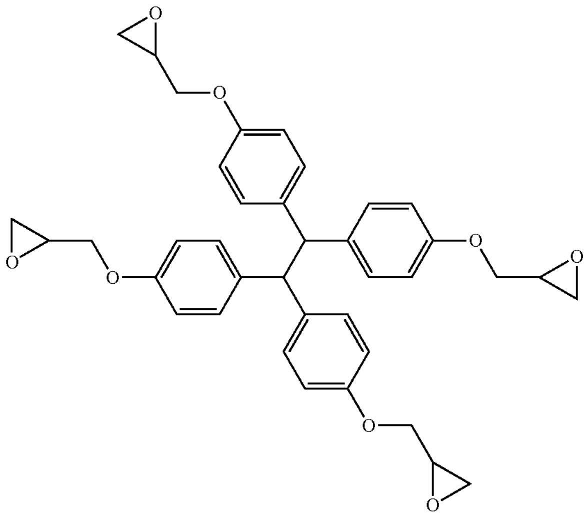
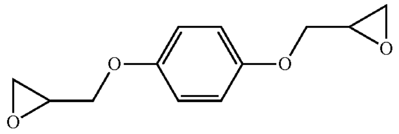
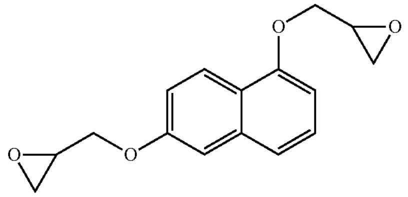
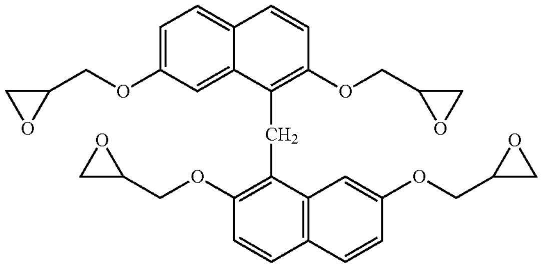
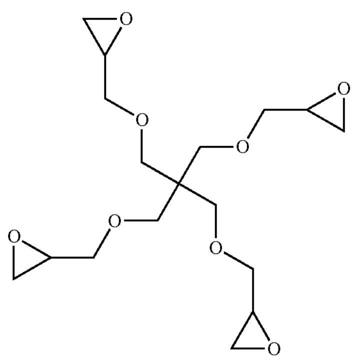
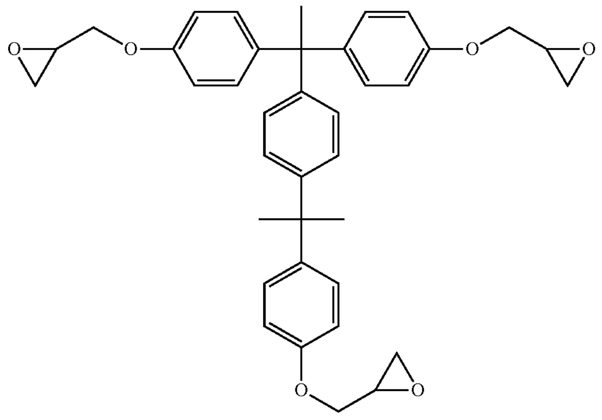

-continued

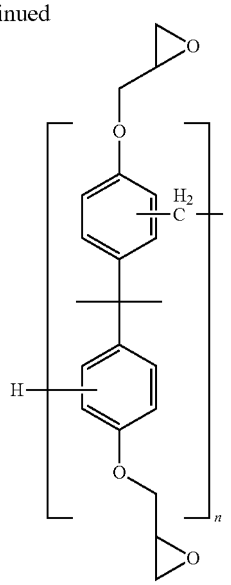

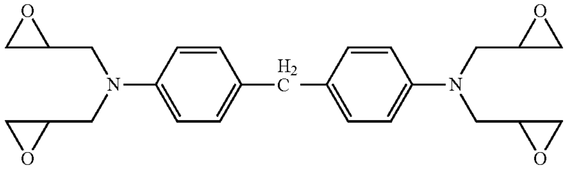

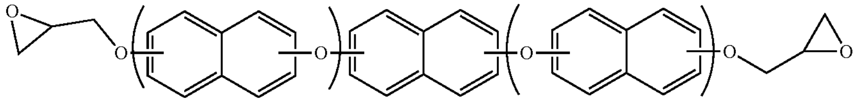

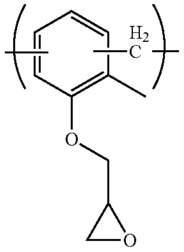

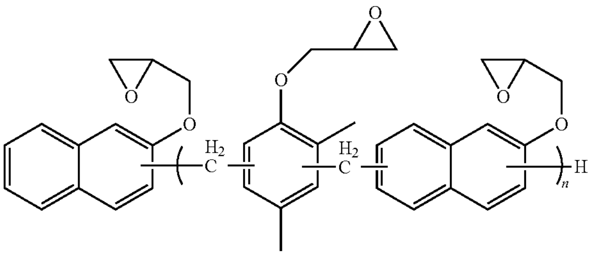

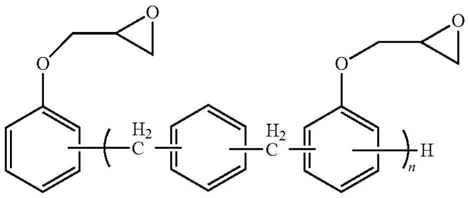

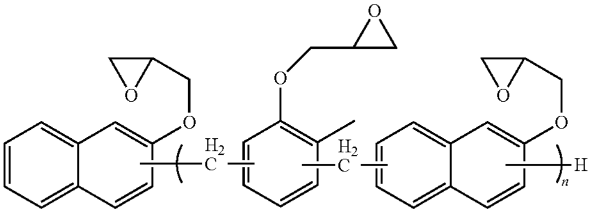

They preferably have a weight average molecular weight of 600 to 1,000,000 or 600 to 200,000.

[Aminoplast Crosslinking Agent]

Examples of the aminoplast crosslinking agent include highly alkylated, alkoxylated, or alkoxyalkylated melamine, benzoguanamine, glycoluril, urea, or a polymer thereof. Preferred are crosslinking agents with at least two crosslink-forming substituents, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, methoxymethylated thiourea, or other compound. Condensates of these compounds may also be used.

The crosslinking agent may also be a highly heat-resistant crosslinking agent. As the highly heat-resistant crosslinking agent, a compound containing a crosslink-forming substituent with an aromatic ring (for example, benzene and naphthalene rings) in the molecule is preferably used.

Preferably, it is at least one member selected from the group consisting of tetramethoxymethylglycoluril and hexamethoxymethylmelamine.

The aminoplast crosslinking agent may be used each alone or in combination of two or more thereof. The aminoplast crosslinking agent may be produced by any method known per se or equivalent method, or may be a commercial product.

The amount of aminoplast crosslinking agent used is 0.001% by mass or more, 0.01% by mass or more, 0.05% by mass or more, 0.5% by mass or more, or 1.0% by mass or more, and 80% by mass or less, 50% by mass or less, 40% by mass or less, 20% by mass or less, or 10% by mass or less of the total solid content of the resist underlayer film-forming composition of the present invention, although it varies depending on, for example, the coating solvent used, the base substrate used, the required solution viscosity, and the required film shape.

Some specific examples are listed below.

[Chemical Formula 13]

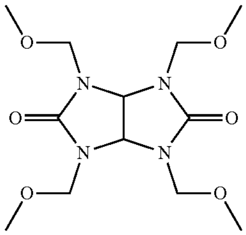

[Chemical Formula 14]

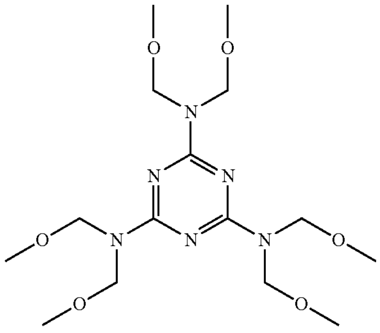

[Phenoplast Crosslinking Agent]

Examples of the phenoplast crosslinking agent include highly alkylated, alkoxylated, or alkoxyalkylated aromatics and polymers thereof. Preferred are crosslinking agents having at least two crosslink-forming substituents per molecule, such as 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane, α,α-bis(4-hydroxy-2,5-dimethylphenyl)-4-formyltoluene, or other compound. Condensates of these compounds may also be used.

The crosslinking agent may also be a highly heat-resistant crosslinking agent. As the highly heat-resistant crosslinking agent, a compound containing a crosslink-forming substituent with an aromatic ring (for example, benzene and naphthalene rings) in the molecule is preferably used.

Preferred is at least one member selected from the group consisting of 3,3',5,5'-tetramethoxymethyl-4,4'-bisphenol and 4-(1,1-dimethylethyl)-2,6-bis(methoxymethyl)phenol.

The phenoplast crosslinking agent may be used each alone or in combination of two or more thereof. The phenoplast crosslinking agent may be produced by any method known per se or equivalent method, or may be a commercial product.

The amount of the phenoplast crosslinking agent is 0.001% by mass or more, 0.01% by mass or more, 0.05% by mass or more, 0.5% by mass or more, or 1.0%% by mass or more, and 80% by mass or less, 50% by mass or less, 40% by mass or less, 20% by mass or less, or 10% by mass or less of the total solid content of the resist underlayer film-forming composition of the present invention, although it varies depending on, for example, the coating solvent used, the base substrate to be used, the required solution viscosity, and the required film shape.

Some specific examples are listed below.

[Chemical Formula 16]

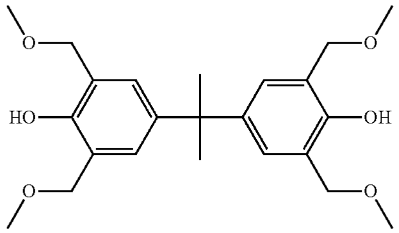

[Chemical Formula 16]

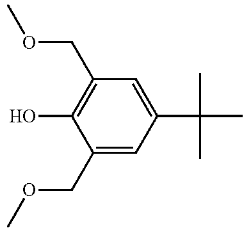

[Crosslinking Catalyst]

The crosslinking catalyst in the present invention is represented by the following formula (I):

[Chemical Formula 17]

$$(A\text{-}SO_3)^-(BH)^+ \qquad (I)$$

wherein A is a linear, branched, or cyclic saturated or unsaturated aliphatic hydrocarbon group which may be substituted, an aryl group which may be substituted with one or more groups other than hydroxy group, or a heteroaryl group which may be substituted, and B is a base having a pKa of 6.5 to 9.5.

Preferably B is $R^1R^2R^3N$, where $R^1$ and $R^2$ each independently represent a linear or branched, saturated or unsaturated aliphatic hydrocarbon group which may be substituted, $R^1$ and $R^2$ may form a ring with or without a heteroatom, $R^3$ represents an aromatic group which may be substituted, or a linear or branched, saturated or unsaturated aliphatic hydrocarbon group which may be substituted, and when $R^1$ and $R^2$ do not form a ring, $R^3$ is an aromatic group which may be substituted.

Preferably, $R^1$ and $R^2$ each independently represent a linear or branched, saturated or unsaturated aliphatic hydrocarbon group which may be substituted, and $R^3$ represents an aromatic group which may be substituted.

Preferably, $R^1$ and $R^2$ each independently represent a linear or branched, saturated or unsaturated aliphatic hydrocarbon group which may be substituted, and $R^3$ represents a phenyl, naphthyl, anthracenyl, or phenanthrenyl group which may be substituted.

Preferably, B is represented by the following formula (II):

[Chemical Formula 18]

(II)

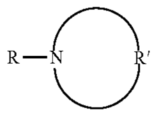

wherein

R is a hydrogen atom, a nitro group, a cyano group, an amino group, a carboxyl group, a halogen atom, an alkoxy group having 1 to 10 carbon atoms, an alkyl group having 1 to 10 carbon atoms, an alkenyl group having 2 to 10 carbon atoms, an aryl group having 6 to 40 carbon atoms, an organic group containing an ether bond, an organic group containing a ketone bond, an organic group containing an ester bond, or a combination thereof, R' is represented by

[Chemical Formula 19]

$$-(R^a)_n-X-(R^b)_m-$$

where IV and $R^b$ each independently represent an optionally substituted alkyl, X is O, S, or $SO_2$, and n, and m are each independently 2, 3, 4, 5, or 6.

Preferably, R is a hydrogen atom, a methyl group, an ethyl group, an allyl group, or a cyanomethyl group, and R' is represented by

[Chemical Formula 20]

$$-(CH_2)_n-O-(CH_2)_m-$$

and n, and m are each independently 2, 3, 4, 5, or 6.

Examples of the linear, branched, or cyclic saturated aliphatic hydrocarbon group include methyl, ethyl, n-propyl, i-propyl, cyclopropyl, n-butyl, i-butyl, s-butyl, t-butyl, cyclobutyl, 1-methyl-cyclopropyl, 2-methyl-cyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1 methyl-cyclopropyl, 2-ethyl-2-methyl-cyclopropyl, and 2-ethyl-3-methyl-cyclopropyl groups.

Examples of the linear, branched, or cyclic unsaturated aliphatic hydrocarbon group include ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1 methyl-1-propenyl, 1-methyl-2-propenyl, 1-pentenyl, 2-pentenyl, 3-pentenyl, 4-pentenyl, 1-n-propyl ethenyl, 1-methyl-1-butenyl, 1-methyl-2-butenyl, 1-methyl-3-butenyl, 2-ethyl-2 propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propyl ethenyl, 1,2-dimethyl-1-propenyl, 1,2-dimethyl-2-propenyl, 1 cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4 methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2 cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methyl ene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methyl ene-cyclopentyl, 1-cyclohexenyl, 2-cyclohexenyl, and 3-cyclohexenyl groups.

Examples of the aryl groups include phenyl, o-methylphenyl, m-methylphenyl, p-methylphenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenyl, m-biphenyl, p-biphenyl, 1-anthryl, 2-anthryl, 9-anthryl, 1-phenanthryl, 2-phenanthryl, 3-phenanthryl, 4-phenanthryl, and 9-phenanthryl groups.

Examples of the heteroaryl groups include furanyl, thiophenyl, pyrrolyl, imidazolyl, pyranyl, pyridinyl, pyrimidinyl, pyrazinyl, pyrrolidinyl, piperidinyl, piperazinyl, morpholinyl, quinuclidinyl, indolyl, purinyl quinolinyl, isoquinolinyl, chromenyl, thiantrenyl, phenothiazinyl, phenoxazinyl, xanthenyl, acridinyl, phenazinyl, and carbazolyl groups.

Aryl and heteroaryl groups are included in the aromatic group.

Examples of the substituent include nitro group, amino group, cyano group, sulfo group, hydroxy group, carboxyl group, halogen atoms, alkoxy group having 1 to 10 carbon atoms, alkyl group having 1 to 10 carbon atoms, alkenyl group having 2 to 10 carbon atoms, aryl group having 6 to 40 carbon atoms, organic group containing an ether bond, organic group containing a ketone bond, organic group containing an ester bond, and combinations thereof.

Examples of the halogen atom include fluorine, chlorine, bromine, and iodine atoms.

Examples of the alkoxy group include methoxy, ethoxy, n-propoxy, i-propoxy, n-butoxy, i-butoxy, s-butoxy, t-butoxy, n-pentyloxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2 dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy, and 1-ethyl-2-methyl-n-propoxy groups.

Examples of the alkyl, alkenyl, and aryl groups are given above.

The organic group containing an ether bond is represented by $R^{11}—O—R^{11}$ ($R^{11}$ each independently represents an alkyl group having 1 to 6 carbons such as a methyl or ethyl group, an alkylene group, a phenyl group, or a phenylene group), and the examples thereof include organic groups containing an ether bond, such as methoxy, ethoxy, and phenoxy groups.

The organic group containing a ketone bond is represented by $R^{21}—C(=O)—R^{21}$ ($R^{21}$ each independently represents an alkyl group having 1 to 6 carbons such as a methyl or ethyl group, an alkylene group, a phenyl group, or a phenylene group), and the examples thereof include organic groups containing a ketone bond, such as acetoxy and benzoyl groups.

The organic group containing an ester bond is represented by $R^{31}—C(=O)O—R^{31}$ ($R^{31}$ each independently represents an alkyl group having 1 to 6 carbons such as a methyl or ethyl group, an alkylene group, a phenyl group, or a phenylene group), and the examples thereof include organic groups containing an ester bond, such as methyl ester, ethyl ester, and phenyl ester.

A does not include an aryl group substituted with a hydroxy group.

Therefore, $(A\text{-}SO_3)^-$ in the present invention excludes anions derived from p-phenolsulfonic acid, o-cresol-4-sulfonic acid, p-cresol-2-sulfonic acid, and the like. Preferably, A excludes an aryl group substituted with a carboxyl group. Therefore, $(A\text{-}SO_3)^-$ in the present invention exclude anions derived from 5-sulfosalicylic acid and the like.

Preferably, A is a methyl, fluoromethyl, or tolyl group.

In the present invention, B is a base having a pKa of 6.5 to 9.5. Specific examples thereof include N-methylmorpholine and N,N-diethylaniline.

Some specific examples of the crosslinking catalysts represented by formula (I) are listed below.

[Chemical Formula 21]

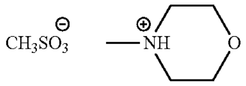

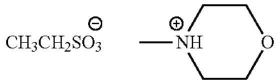

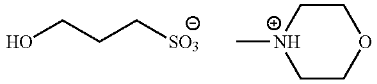

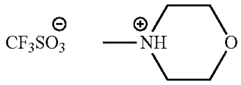

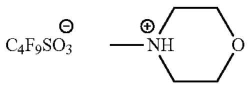

-continued

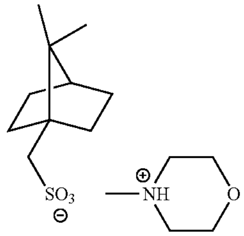

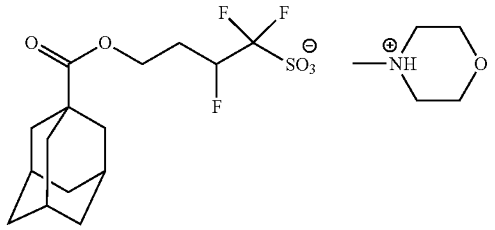

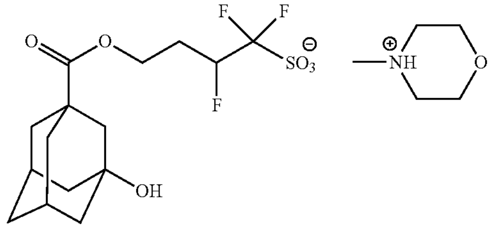

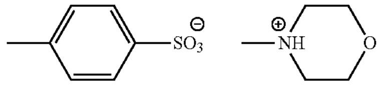

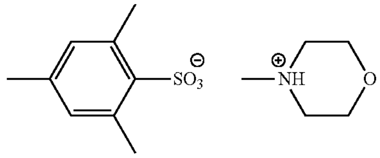

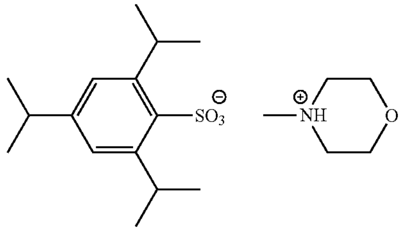

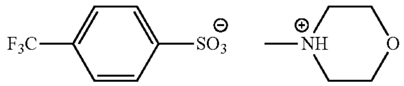

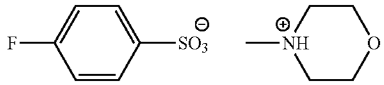

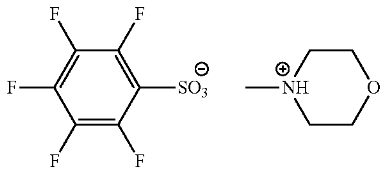

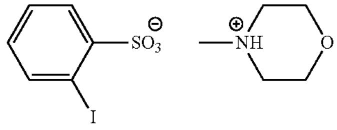

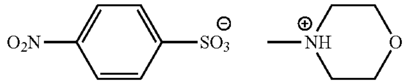

-continued
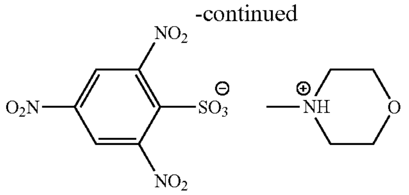
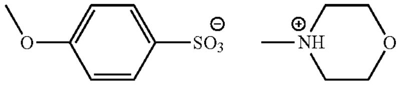
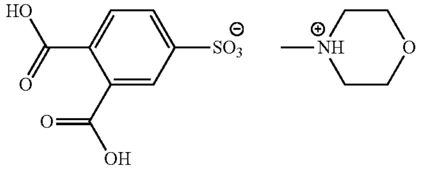
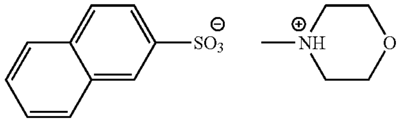
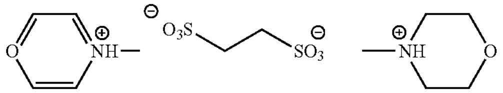
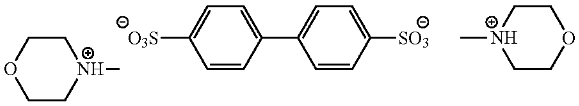
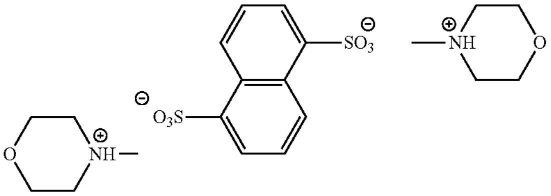
[Chemical Formula 22]
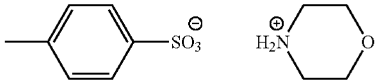
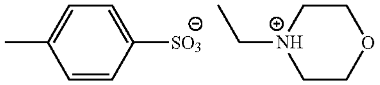
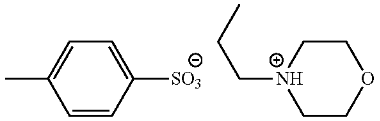
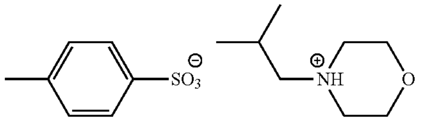
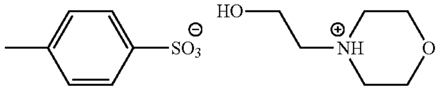
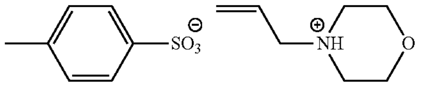
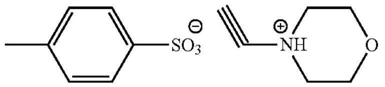
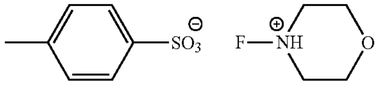
-continued
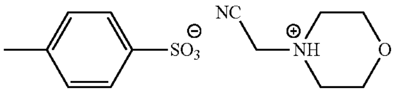
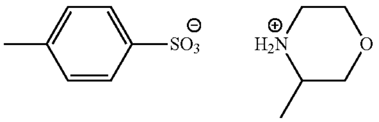
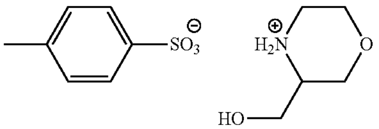
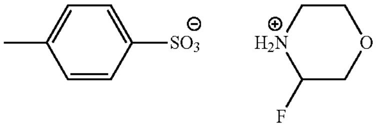
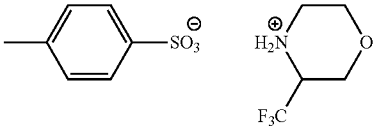
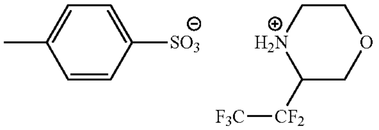
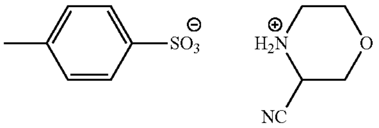
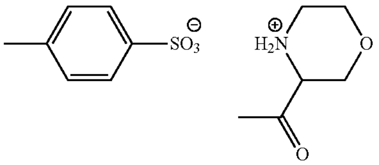
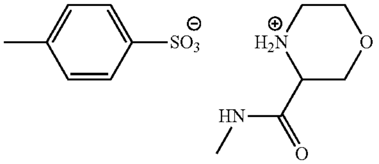
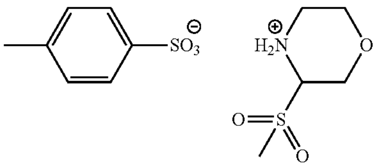
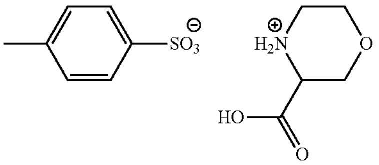
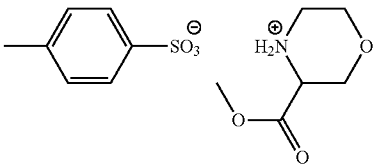

-continued

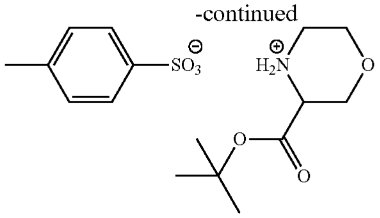

[Chemical Formula 23]

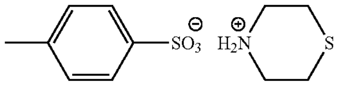

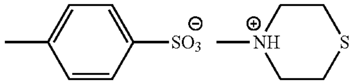

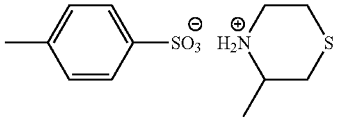

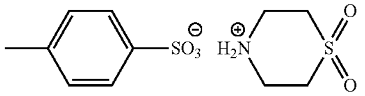

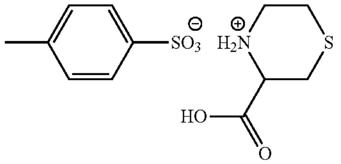

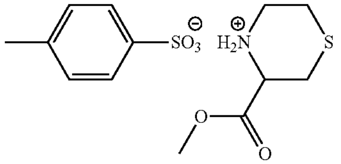

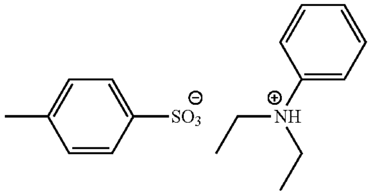

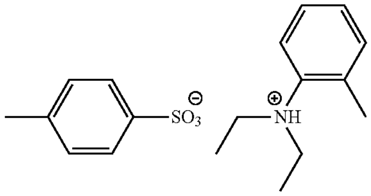

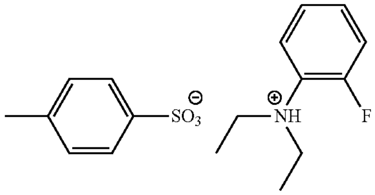

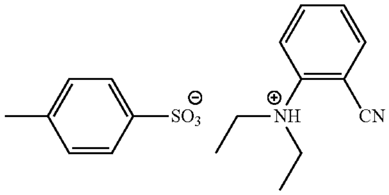

-continued

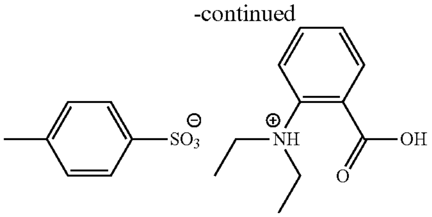

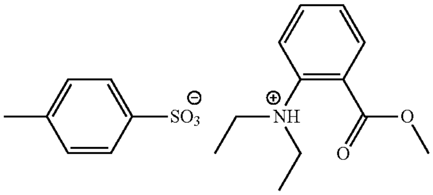

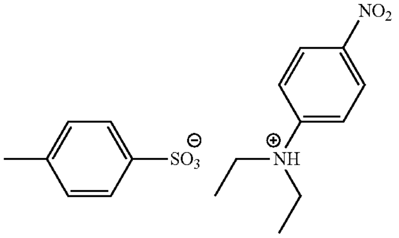

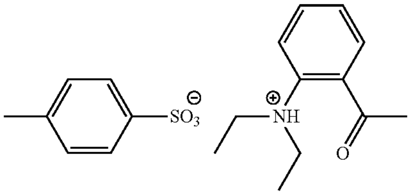

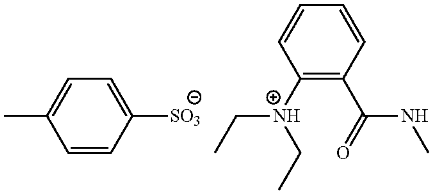

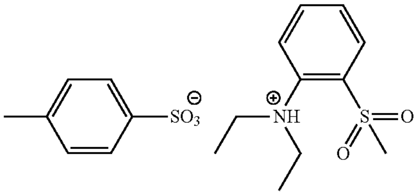

The amount of the crosslinking catalyst is within the range of from 0.0001 to 20% by mass, preferably from 0.0005 to 10% by mass, and even more preferably from 0.01 to 3% by mass of the total solid content in the resist underlayer film-forming composition.

The resist underlayer film-forming composition of the present invention may include, in addition to the above, for example, a solvent, a surfactant, a light absorbing agent, a rheology modifier, and an adhesion aid as necessary.

[Solvent]

The resist underlayer film-forming composition of the present invention may further include, as a solvent, an alcoholic hydroxy group-containing compound or a compound containing a group capable of forming one or more alcoholic hydroxy groups. These are usually used in an amount that uniformly dissolves the above crosslinkable resin, aminoplast or phenoplast crosslinking agent, and crosslinking catalyst represented by formula (I).

The alcoholic hydroxy group-containing compound or the compound containing a group capable of forming one or more alcoholic hydroxy groups may be, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, cyclopentanone, cyclohexanone, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate.

Of these, propylene glycol-based solvents, oxyisobutyric acid ester-based solvents, and butylene glycol-based solvents are preferred.

The alcoholic hydroxy group-containing compound or the compound containing a group capable of forming one or more alcoholic hydroxy groups may be used each alone or in combination of two or more thereof.

Furthermore, a high-boiling solvent such as propylene glycol monobutyl ether and propylene glycol monobutyl ether acetate may be used in combination.

Preferable examples include propylene glycol monomethyl ether, propylene glycol monomethyl ether acetate, ethyl lactate, butyl lactate, and cyclohexanone, and more preferable examples are propylene glycol monomethyl ether and propylene glycol monomethyl ether acetate.

[Surfactant]

The resist underlayer film-forming composition of the present invention may include a surfactant to further improve the application property to uneven surfaces without pinholes, striations, and the like.

Examples of the surfactant include nonionic surfactants such as polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl allyl ethers such as polyoxyethylene octyl phenol ether and polyoxyethylene nonyl phenol ethers; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants such as F-Top EF301, EF303, and EF352 (trade names, manufactured by Tohchem Products Co., Ltd.), Megaface F171, F173, R-30, and R-40 (trade names, manufactured by Dainippon Ink and Chemicals, Inc.), Fluorad FC430 and FC431 (trade names, manufactured by Sumitomo 3M Limited.), and Asahi Guard AG710, Surflon S-382, SC101, SC102, SC103, SC104, SC105, and SC106 (trade names, manufactured by Asahi Glass Co., Ltd.); and organosiloxane polymer KP341 (manufactured by Shin-Etsu Chemical Co., Ltd.). The blending amount of these surfactants is usually 2.0% by mass or less, preferably 1.0% by mass or less of the total solid content of the resist underlayer film-forming composition of the present invention. These surfactants may be added each alone or in combination of two or more thereof.

[Other Additives]

In addition to the crosslinking catalyst of formula (I), the resist underlayer film-forming composition of the present invention may also include a catalyst to promote the crosslinking reaction; for example, acidic compounds such as citric acid; thermal acid generators such as 2,4,4,6-tetrabromocyclohexadienone, benzoin tosylate, 2-nitrobenzyl tosylate, and other organic sulfonic acid alkyl esters; onium salt-based photoacid generators such as bis(4-t-butylphenyl) iodonium trifluoromethanesulfonate and triphenylsulfonium trifluoromethanesulfonate; halogen-containing compound-based photoacid generators such as phenyl-bis(trichloromethyl)-s-triazine; and sulfonic acid-based photoacid generators such as benzoin tosylate and N-hydroxysuccinimide trifluoromethanesulfonate.

Preferable examples of the light absorbing agent include commercially available absorbents listed in "Technology and Market of Industrial Dyes" (CMC Publishing Co., Ltd.) and "Dye Handbook" (edited by The Society of Synthetic Organic Chemistry, Japan), such as C.I. Disperse Yellow 1, 3, 4, 5, 7, 8, 13, 23, 31, 49, 50, 51, 54, 60, 64, 66, 68, 79, 82, 88, 90, 93, 102, 114, and 124; C.I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C.I. Disperse Violet 43; C.I. Disperse Blue 96; C.I. Fluorescent Brightening Agent 112, 135, and 163; C.I. Solvent Orange 2 and 45; C.I. Solvent Red 1, 3, 8, 23, 24, 25, 27, and 49; C.I. Pigment Green 10; and C.I. Pigment Brown 2. The blending amount of the light absorbing agent is usually 10% by mass or less, preferably 5% by mass or less of the total solid content of the resist underlayer film-forming composition of the present invention.

The rheology modifier is added mainly to improve the fluidity of the resist underlayer film-forming composition, especially in the baking step, to improve the uniformity of the resist underlayer film thickness and the filling property of the resist underlayer film-forming composition into the hole. Specific examples thereof include phthalic acid derivatives such as dimethyl phthalate, diethyl phthalate, diisobutyl phthalate, dihexyl phthalate, and butyl isodecyl phthalate; adipic acid derivatives such as dinormal butyl adipate, diisobutyl adipate, diisooctyl adipate, and octyldecyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. The blending amount of the rheology modifier is usually less than 30% by mass of the total solid content of the resist underlayer film-forming composition of the present invention.

The adhesion aid is added mainly to improve the adhesion between the substrate or resist and the resist underlayer film-forming composition, especially to prevent the resist from peeling off during the development. Specific examples thereof include chlorosilanes such as trimethylchlorosilane, dimethylvinylchlorosilane, methyldiphenylchlorosilane, and chloromethyl dimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyl trichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercapto-benzothiazole, 2-mercaptobenzoxazole, urazole, thiouracil, mercaptoimidazole, and mercaptopyrimidine; urea such as 1,1-dimethylurea and 1,3-dimethylurea; and thiourea compounds. The blending amount of the adhesion aid is usually less than 5% by mass, preferably less than 2% by mass of the total solid content of the resist underlayer film-forming composition of the present invention.

The solid content of the resist underlayer film-forming composition of the present invention is within the range of from 0.1 to 70% by mass, or from 0.1 to 60% by mass. The solid content is the percentage of all components in the resist underlayer film-forming composition minus the solvent. The content of the crosslinkable resin in the solid content may be within the range of from 1 to 99.9% by mass, from 50 to 99.9% by mass, from 50 to 95% by mass, or from 50 to 90% by mass.

According to the present invention, a semiconductor device may be produced through the steps of: forming a resist underlayer film on a semiconductor substrate using a resist underlayer film-forming composition, forming a resist film thereon, forming a resist pattern by irradiation with a light or electron beam followed by development, etching the resist underlayer film using the formed resist pattern, and processing the semiconductor substrate using the patterned resist underlayer film.

In addition, according to the present invention, a semiconductor device may be produced through the steps of: forming a resist underlayer film on a semiconductor substrate using a resist underlayer film-forming composition, forming a hard mask thereon, forming a resist film thereon, forming a resist pattern by irradiation with a light or electron beam followed by development, etching the hard mask using the formed resist pattern, etching the resist underlayer film using the patterned resist underlayer film, and processing the semiconductor substrate using the patterned resist underlayer film. Preferably, the hard mask is formed by application or vapor deposition of an inorganic substance.

A resist underlayer film is obtained by applying the resist underlayer film-forming composition of the present invention to a semiconductor substrate, followed by baking. By forming such a resist underlayer film, the resist pattern used in the production of semiconductors may be formed. This resist pattern forming method is explained: in the method, a resist underlayer film-forming composition is applied to a substrate used for producing precision integrated circuit devices (for example, transparent substrates such as silicon/silicon dioxide-coated, glass, and ITO substrates) using an appropriate coating method such as a spinner or coater, followed by baking and curing, to prepare a spin-on underlayer film (resist underlayer film). The thickness of the resist underlayer film is preferably within the range of from 0.01 to 3.0 μm. The baking after application is usually performed at 80 to 350° C. for 0.5 to 120 minutes.

Then, a resist is applied directly to the resist underlayer film, or, as necessary, to one or several layers of a coating film material deposited on the resist underlayer film to form a resist film, which is then irradiated with a light or electron beam through a specified mask, developed, rinsed, and dried to obtain a good resist pattern.

As necessary, post-exposure baking (PEB) may be performed after irradiation with a light or electron beam. The resist underlayer film in the area where the resist has been developed and removed by the above-explained steps is then be removed by dry etching to form the desired pattern on the substrate.

A hard mask may be formed on the resist underlayer film, and the hard mask may be formed by application or vapor deposition of an inorganic substance. The hard mask may be etched and patterned using the resist pattern formed. The resist underlayer film is etched through the patterned hard mask, and the semiconductor substrate can be processed by the patterned resist underlayer film.

The resist used in this invention is a photoresist or electron beam resist.

The photoresist applied on the top of the resist underlayer film for lithography in the present invention may be either negative or positive type, and the examples thereof include positive photoresists including a novolac resin and 1,2-naphthoquinone diazide sulfonate; chemically amplified photoresists including a binder having a group that is degraded by acid to increase the alkali dissolution rate and a photo acid generator; chemically amplified photoresists including an alkali-soluble binder, a low molecular weight compound that increases the alkali dissolution rate of photoresist by acid degradation, and a photoacid generator; and photoresists with Si atoms in the backbone, such as APEX-E (trade name, manufactured by Rohm and Haas Company).

Examples of the electron beam resist applied on the top of the resist underlayer film for lithography in the present invention include compositions including a resin containing a Si—Si bond in the main chain and an aromatic ring at the end, and an acid generator that generates an acid upon electron beam irradiation; and compositions including poly (p-hydroxystyrene) having a hydroxyl group substituted with an organic group containing an N-carboxyamine and an acid generator that generates an acid upon irradiation with an electron beam. In the latter type of electron beam resist composition, the acid generated from the acid generator reacts with the N-carboxyamino group of the polymer side chain upon electron beam irradiation, causing the polymer side chain to decompose into hydroxyl groups, which become alkaline soluble and dissolve in the alkaline developing solution to form a resist pattern. Examples of the acid generator that generate acid upon electron beam irradiation include halogenated organic compounds such as 1,1-bis[p-chlorophenyl]-2,2,2-trichloroethane 1,1-bis[p-methoxyphenyl]-2,2,2-trichloroethane, 1,1-bis[p-chlorophenyl]-2,2-dichloroethane, and 2-chloro-6-(trichloromethyl)pyridine; triphenylsulfonium salts; onium salts such as diphenyliodonium salts; and sulfonic acid esters such as nitrobenzyltosylate and dinitrobenzyltosylate.

The exposure light at the photoresist is a chemical ray such as near ultraviolet, far ultraviolet, or extreme ultraviolet (for example, EUV, wavelength 13.5 nm), and may be, for example, light with a wavelength of 248 nm (KrF laser light), 193 nm (ArF laser light), or 157 nm (F2 laser light). The method of light irradiation is not particularly limited as long as it permits generating an acid from the photoacid generator, and the exposure dose is within the range of from 1 to 2000 $mJ/cm^2$, from 10 to 1500 $mJ/cm^2$, or from 50 to 1000 $mJ/cm^2$.

The electron beam irradiation of the electron beam resist may be performed using, for example, an electron beam irradiation device.

Examples of the developing solution for the resist having a resist underlayer film formed using the resist underlayer film-forming composition of the present invention include aqueous solutions of alkalis such as inorganic alkalis such as sodium hydroxide, potassium hydroxide, sodium carbonate, sodium silicate, sodium metasilicate, and ammonia water; primary amines such as ethylamine and n propylamine; secondary amines such as diethylamine and di-n-butylamine; tertiary amines such as triethylamine and methyl diethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. In addition, an alcohol such as isopropyl alcohol and a surfactant such as nonionic surfactants may be added in an appropriate amount to the above aqueous alkali solutions. Of these developing solutions, quaternary ammonium salts are preferred, and tetramethylammonium hydroxide and choline are more preferred.

In the present invention, an organic solvent may be used as a developing solution. After the exposure, development is performed with a developing solution (solvent). Thereby, for example, when a positive photoresist is used, the photoresist in the unexposed area is removed, to form a pattern of the photoresist.

Examples of the developing solution include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2 methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. In addition, a surfactant and other agents may be added to these developing solutions. The conditions for the development are selected from a temperature of 5 to 50° C. and a time of 10 to 600 seconds.

The crosslinking catalyst used in the resist underlayer film-forming composition of the present invention, which contains a crosslinkable resin and an aminoplast or phenoplast crosslinking agent, is characterized by the fact that a compound having a moderate pKa is selected as a base to pair with the sulfonic acid. This crosslinking catalyst has a high storage stability, because it inhibits side reactions of the aminoplast crosslinking agent (for example, reactions with solvents), and suppresses the amount of sublimates generated, because it requires a relatively low curing start temperature of the resist underlayer film, and can form a film from crosslinkable resin that does not leach into a photoresist solvent with high productivity.

EXAMPLES

The following examples are provided to illustrate the present invention in detail, but the invention is not limited to these examples.

Synthesis Example 1

0.20 g of methanesulfonic acid (manufactured by Tokyo Chemical Industry Co., Ltd.) was dissolved in 81.69 g of propylene glycol monomethyl ether, thereto was added 0.21 g of N-methylmorpholine (manufactured by Tokyo Chemical Industry Co., Ltd.) at room temperature, and the mixture was stirred for 12 hours to obtain a solution of the crosslinking catalyst represented by formula (1-1) in propylene glycol monomethyl ether.

[Chemical Formula 24]

Formula (1-1)

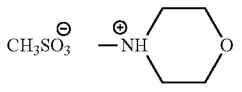

Synthesis Example 2

0.20 g of p-toluenesulfonic acid monohydrate (manufactured by Tokyo Chemical Industry Co., Ltd.) was dissolved in 62.94 g of propylene glycol monomethyl ether, thereto was added 0.12 g of N-methylmorpholine (manufactured by Tokyo Chemical Industry Co., Ltd.) at room temperature, and the mixture was stirred for 12 hours to obtain a solution of the crosslinking catalyst represented by formula (1-2) in propylene glycol monomethyl ether.

[Chemical Formula 25]

Formula (1-2)

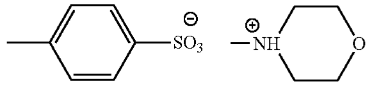

Synthesis Example 3

0.20 g of p-toluenesulfonic acid monohydrate (manufactured by Tokyo Chemical Industry Co., Ltd.) was dissolved in 73.94 g of propylene glycol monomethyl ether, thereto was added 0.17 g of N,N-diethylaniline (manufactured by Tokyo Chemical Industry Co., Ltd.) at room temperature, and the mixture was stirred for 12 hours to obtain a solution of the crosslinking catalyst represented by formula (1-3) in propylene glycol monomethyl ether.

[Chemical Formula 26]

Formula (1-3)

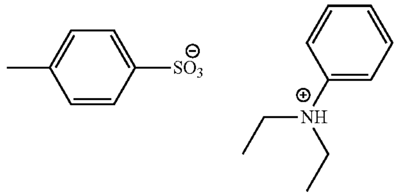

Synthesis Example 4

0.20 g of trifluoromethanesulfonic acid (manufactured by Tokyo Chemical Industry Co., Ltd.) was dissolved in 66.35 g of propylene glycol monomethyl ether, thereto was added 0.13 g of N-methylmorpholine (manufactured by Tokyo Chemical Industry Co., Ltd.) at room temperature, and the mixture was stirred for 12 hours to obtain a solution of the crosslinking catalyst represented by formula (1-4) in propylene glycol monomethyl ether.

[Chemical Formula 27]

Formula (1-4)

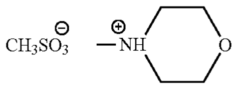

Synthesis Example 5

0.20 g of methanesulfonic acid (manufactured by Tokyo Chemical Industry Co., Ltd.) was dissolved in 72.39 g of propylene glycol monomethyl ether, thereto was added 0.16 g of pyridine (manufactured by Tokyo Chemical Industry Co., Ltd.) at room temperature, and the mixture was stirred for 12 hours to obtain a solution of the crosslinking catalyst represented by formula (1-5) in propylene glycol monomethyl ether.

[Chemical Formula 28]

Formula (1-5)

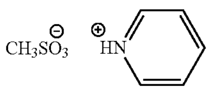

Synthesis Example 6

0.20 g of p-toluenesulfonic acid monohydrate (manufactured by Tokyo Chemical Industry Co., Ltd.) was dissolved in 63.19 g of propylene glycol monomethyl ether, thereto was added 0.12 g of N,N-dimethylbutylamine (manufactured by Tokyo Chemical Industry Co., Ltd.) at room temperature, and the mixture was stirred for 12 hours to obtain a solution of the crosslinking catalyst represented by formula (1-6) in propylene glycol monomethyl ether.

[Chemical Formula 29]

Formula (1-6)

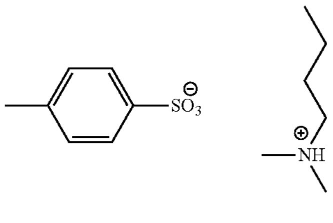

Example 1

0.23 g of an acrylic resin of the resist underlayer film-forming composition represented by formula (2-1) below, 0.058 g of tetramethoxymethyl glycoluril (trade name: POWDER LINK® 1174, manufactured by Nippon Scientific Co., Ltd.) as a crosslinking agent, 1.32 g of the solution of crosslinking catalyst in propylene glycol monomethyl ether obtained in Synthesis Example 1, and 0.0023 g of MEGAFACE R-40 (trade name, manufactured by DIC Corporation) as a surfactant were dissolved in 28.39 g of propylene glycol monomethyl ether to prepare a solution of the resist underlayer film-forming composition for lithography.

[Chemical Formula 30]

Formula (2-1)

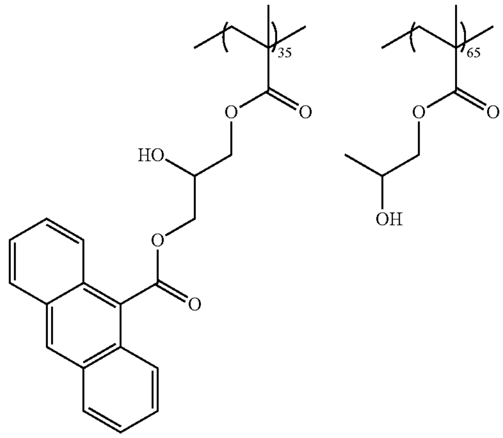

Example 2

0.23 g of an acrylic resin of the resist underlayer film-forming composition represented by formula (2-1) above, 0.058 g of tetramethoxymethyl glycoluril (trade name: POWDER LINK® 1174, manufactured by Nippon Scientific Co., Ltd.) as a crosslinking agent, 1.83 g of the solution of the crosslinking catalyst in propylene glycol monomethyl ether obtained in Synthesis Example 2, and 0.0023 g of MEGAFACE R-40 (trade name, manufactured by DIC Corporation) as a surfactant were dissolved in 27.88 g of propylene glycol monomethyl ether to prepare a solution of the resist underlayer film-forming composition for lithography.

Example 3

0.23 g of an acrylic resin of the resist underlayer film-forming composition represented by formula (2-1) above, 0.058 g of tetramethoxymethyl glycoluril (trade name: POWDER LINK® 1174, manufactured by Nippon Scientific Co., Ltd.) as a crosslinking agent, 1.68 g of the solution of the crosslinking catalyst in propylene glycol monomethyl ether obtained in Synthesis Example 3, and 0.0023 g of MEGAFACE R-40 (trade name, manufactured by DIC Corporation) as a surfactant were dissolved in 28.30 g of propylene glycol monomethyl ether to prepare a solution of the resist underlayer film-forming composition for lithography.

Example 4

0.23 g of an acrylic resin of the resist underlayer film-forming composition represented by formula (2-1) above, 0.058 g of tetramethoxymethyl glycoluril (trade name: POWDER LINK® 1174, manufactured by Nippon Scientific Co., Ltd.) as a crosslinking agent, 2.16 g of the solution of the crosslinking catalyst in propylene glycol monomethyl ether obtained in Synthesis Example 4, and 0.0023 g of MEGAFACE R-40 (trade name, manufactured by DIC Corporation) as a surfactant were dissolved in 27.55 g of propylene glycol monomethyl ether to prepare a solution of the resist underlayer film-forming composition for lithography.

Example 5

0.23 g of an acrylic resin of the resist underlayer film-forming composition represented by formula (2-1) above, 0.058 g of hexamethoxymethylmelamine (trade name: MW-390® NIKALAC, manufactured by Sanwa Chemical Co., Ltd.) as a crosslinking agent, 1.83 g of the solution of the crosslinking catalyst in propylene glycol monomethyl ether obtained in Synthesis Example 2, and 0.002 g of MEGAFACE R-40 (trade name, manufactured by DIC Corporation) as a surfactant were dissolved in 27.88 g of propylene glycol monomethyl ether to prepare a solution of the resist underlayer film-forming composition for lithography.

Example 6

0.23 g of an acrylic resin of the resist underlayer film-forming composition represented by formula (2-1) above, 0.058 g of hexamethoxymethylmelamine (trade name: MW-390® NIKALAC, manufactured by Sanwa Chemical Co., Ltd.) as a crosslinking agent, 1.68 g of the solution of the crosslinking catalyst in propylene glycol monomethyl ether obtained in Synthesis Example 4, and 0.0023 g of MEGAFACE R-40 (trade name, manufactured by DIC Corporation) as a surfactant were dissolved in 28.30 g of propylene glycol monomethyl ether to prepare a solution of the resist underlayer film-forming composition for lithography.

Example 7

0.40 g of a novolac epoxy resin (trade name: EOCN-1045, manufactured by Nippon Kayaku Co., Ltd.) of the resist underlayer film-forming composition represented by formula (2-2) below and 0.49 g of the solution of the crosslinking catalyst in propylene glycol monomethyl ether obtained in Synthesis Example 4 were dissolved in 5.27 g of propylene glycol monomethyl ether and 3.84 g of propylene glycol monomethyl ether acetate to prepare a solution of the resist underlayer film-forming composition for lithography.

[Chemical Formula 31]

Formula (2-2)

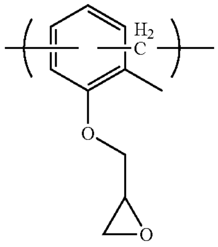

Comparative Example 1

0.23 g of an acrylic resin of the resist underlayer film-forming composition represented by formula (2-1) above, 0.058 g of tetramethoxymethyl glycoluril (trade name: POWDER LINK® 1174, manufactured by Nippon Scientific Co., Ltd.) as a crosslinking agent, 1.18 g of the solution of the crosslinking catalyst in propylene glycol monomethyl ether obtained in Synthesis Example 5, and 0.002 g of MEGAFACE R-40 (trade name, manufactured by DIC Corporation) as a surfactant were dissolved in 28.53 g of propylene glycol monomethyl ether to prepare a solution of the resist underlayer film-forming composition for lithography.

Comparative Example 2

0.23 g of an acrylic resin of the resist underlayer film-forming composition represented by formula (2-1) above, 0.058 g of tetramethoxymethyl glycoluril (trade name: POWDER LINK® 1174, manufactured by Nippon Scientific Co., Ltd.) as a crosslinking agent, 0.008 g of pyridinium-p-toluenesulfonate as a crosslinking catalyst represented by formula (1-7) (manufactured by Midori Kagaku Co., Ltd.), and 0.002 g of MEGAFACE R-40 (trade name, manufactured by DIC Corporation) as a surfactant were dissolved in 29.70 g of propylene glycol monomethyl ether to prepare a solution of the resist underlayer film-forming composition for lithography.

[Chemical Formula 26]

Formula (1-7)

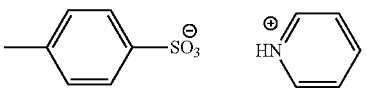

Comparative Example 3

0.23 g of an acrylic resin of the resist underlayer film-forming composition represented by formula (2-1) above, 0.058 g of tetramethoxymethyl glycoluril (trade name: POWDER LINK® 1174, manufactured by Nippon Scientific Co., Ltd.) as a crosslinking agent, 0.008 g of pyridinium trifluoromethanesulfonate as a crosslinking catalyst represented by formula (1-8) (manufactured by ADEKA Corporation), and 0.002 g of MEGAFACE R-40 (trade name, DIC Corporation) as a surfactant were dissolved in 29.70 g of propylene glycol monomethyl ether to prepare a solution of the resist underlayer film-forming composition for lithography.

[Chemical Formula 33]

Formula (1-8)

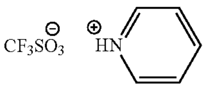

Comparative Example 4

0.23 g of an acrylic resin of the resist underlayer film-forming composition represented by formula (2-1) above, 0.058 g of hexamethoxymethylmelamine (trade name: MW-390® NIKALAC, manufactured by Sanwa Chemical Co., Ltd.) as a crosslinking agent, 0.008 g of pyridinium-p-toluenesulfonate as a crosslinking catalyst represented by formula (1-7) (manufactured by Midori Kagaku Co., Ltd.), and 0.002 g of MEGAFACE R-40 (trade name, manufactured by DIC Corporation) as a surfactant were dissolved in 29.70 g of propylene glycol monomethyl ether to prepare a solution of the resist underlayer film-forming composition for lithography.

Comparative Example 5

0.23 g of an acrylic resin of the resist underlayer film-forming composition represented by formula (2-1) above, 0.058 g of hexamethoxymethylmelamine (trade name: MW-390® NIKALAC, manufactured by Sanwa Chemical Co., Ltd.) as a crosslinking agent, 0.008 g of pyridinium trifluoromethanesulfonate as a crosslinking catalyst represented by formula (1-8) (manufactured by ADEKA Corporation), and 0.002 g of MEGAFACE R-40 (trade name, manufactured by DIC Corporation) as a surfactant were dissolved in 29.70 g of propylene glycol monomethyl ether to prepare a solution of the resist underlayer film-forming composition for lithography.

Comparative Example 6

0.23 g of an acrylic resin of the resist underlayer film-forming composition represented by formula (2-1) above, 0.058 g of tetramethoxymethyl glycoluril (trade name: POWDER LINK® 1174, manufactured by Nippon Scientific Co., Ltd.) as a crosslinking agent, 1.83 g of the solution of the crosslinking catalyst in propylene glycol monomethyl ether obtained in Synthesis Example 6, and 0.002 g of MEGAFACE R-40 (trade name, DIC Corporation) as a surfactant were dissolved in 27.88 g of propylene glycol monomethyl ether to prepare a solution of the resist underlayer film-forming composition for lithography.

Comparative Example 7

0.40 g of a novolac epoxy resin of the resist underlayer film-forming composition represented by the above formula (2-2) and 0.002 g of pyridinium trifluoromethanesulfonate (manufactured by ADEKA Corporation) as a crosslinking catalyst represented by formula (1-8) were dissolved in 5.76 g of propylene glycol monomethyl ether and 3.84 g of propylene glycol monomethyl ether acetate to prepare a solution of the resist underlayer film-forming composition for lithography.

(Leaching Test in Photoresist Solvent)

Each of the resist underlayer film-forming compositions for lithography prepared in Examples 1 to 4 and Comparative Examples 1 to 3 was applied to a silicon wafer, which is a semiconductor substrate, by a spinner. The silicon wafers were placed on a hot plate and baked at 230° C. for 1 minute to form resist underlayer films of 20 nm to 30 nm thickness. These resist underlayer films were immersed in a mixed solvent of 70% by mass of propylene glycol monomethyl ether and 30% by mass of propylene glycol monomethyl ether acetate for 1 minute, and the change in thickness of the coating film before and after the immersion was confirmed to be 5% or less. This result indicates that a resist or a resist underlayer film can be laminated on a coating film produced using the resist underlayer film-forming compositions for lithography prepared in Examples 1 to 4 and Comparative Examples 1 to 3.

(Storage Stability Test of Resist Underlayer Film-Forming Composition)

Storage stability testing of the crosslinking agent was specifically performed by the following method. Samples from Examples 1 to 6 and Comparative Examples 1 to 5 were stored at 35° C. for 3 weeks, and the peak area of the crosslinking agent (A) and the peak area of the degenerated product (B) in the resist underlayer film-forming composition were calculated by gel permeation chromatography (GPC) to determine the peak area % for the crosslinking agent (A/[A+B]×100) and the peak area % for the degenerated product (B/[A+B]×100). That is, a larger degeneration rate means a faster degeneration rate of the crosslinking agent in the resist underlayer film-forming composition, and a smaller degeneration rate is desirable in the storage stability test. Incidentally, the peak area % (A/[A+B]×100) of the crosslinking agent and the peak area % (B/[A+B]×100) of the degenerated product are shown in Tables 1 and 2, and Table 1 shows the results of using tetramethoxymethyl glycoluril as the crosslinking agent and Table 2 shows the results of using hexamethoxymethyl melamine as the crosslinking agent. The pKa of the bases in the crosslinking catalysts in Tables 1, 2, 3, and 4 were taken from the following literatures.

Reference Literature 1: J. Org. Chem. 1960, 25, 2, 290-290

Reference Literature 2: Supervised by Fujio Kotake, "Large Organic Chemistry, Separate Volume 2, Organic Chemical Constants Handbook", p. 584 (1963), (Asakura Publishing Co., Ltd.)

Reference Literature 3: CAN. J. CHEM. VOL. 1993, 71

Reference Literature 4: Tetrahedron Letters 2012, 53, 1830-1832

TABLE 1

Comparison of degeneration rates of crosslinking agents in resist underlayer film forming compositions

| | | Before storage stability test | | After storage stability test | |
|---|---|---|---|---|---|
| | pKa of base catalyst in crosslinking | Crosslinking agent | Degenerated product [degeneration rate] | Crosslinking agent | Degenerated product [degeneration rate] |
| Example 1 | 7.40 | 91.3 | 8.7 | 87.8 | 12.2 |
| Example 2 | 7.40 | 90.4 | 9.6 | 87.8 | 12.2 |
| Example 3 | 6.56 | 89.7 | 10.3 | 77.9 | 22.1 |
| Example 4 | 7.40 | 90.4 | 9.6 | 87.3 | 12.7 |
| Comparative Example 1 | 5.25 | 93.3 | 6.7 | 60.3 | 39.7 |

TABLE 1-continued

Comparison of degeneration rates of crosslinking agents in resist underlayer film forming compositions

| | | Before storage stability test | | After storage stability test | |
|---|---|---|---|---|---|
| | pKa of base catalyst in crosslinking | Crosslinking agent | Degenerated product [degeneration rate] | Crosslinking agent | Degenerated product [degeneration rate] |
| Comparative Example 2 | <5.25 | 94.4 | 5.6 | 61.5 | 38.5 |
| Comparative Example 3 | 5.25 | 94.7 | J.o | 77.7 | 22.3 |

TABLE 2

Comparison of degeneration rates of crosslinking agents in resist underlayer film forming compositions

| | | Before storage stability test | | After storage stability test | |
|---|---|---|---|---|---|
| | pKa of base in crosslinking catalyst | Crosslinking agent | Degenerated product [degeneration rate] | Crosslinking agent | Degenerated product [degeneration rate] |
| Example 5 | 7.40 | 94.3 | 5.7 | 86.5 | 13.5 |
| Example 6 | 7.40 | 99.7 | 0.3 | 91.1 | 8.9 |
| Comparative Example 4 | 5.25 | 91.9 | 8.1 | 7.4 | 92.6 |
| Comparative Example 5 | 5.25 | 83.4 | 16.6 | 10.1 | 89.9 |

Table 1 shows that the degeneration rate of the crosslinking agent in the resist underlayer film-forming composition of Example 1 is lower than that of the crosslinking agent in the resist underlayer film-forming composition of Comparative Example 1. The degeneration rate of the crosslinking agent in the resist underlayer film-forming compositions of Examples 2 and 3 is lower than that of the crosslinking agent in the resist underlayer film-forming composition of Comparative Example 2. The degeneration rate of the crosslinking agent in the resist underlayer film-forming composition of Example 4 is lower than that of the crosslinking agent in the resist underlayer film-forming composition of Comparative Example 3. That is, the crosslinking catalysts used in Examples 1 to 4 can effectively suppress the degeneration of the crosslinking agent. Table 2 shows that the degeneration rate of the crosslinking agent in the resist underlayer film-forming composition of Example 5 is lower than that of the crosslinking agent in the resist underlayer film-forming composition of Comparative Example 4. The degeneration rate of the crosslinking agent in the resist underlayer film-forming composition of Example 6 is lower than that of the crosslinking agent in the resist underlayer film-forming composition of Comparative Example 5. That is, the crosslinking catalysts used in Examples 4 and 5 can effectively suppress the degeneration of the crosslinking agent regardless of the type of crosslinking agent in the resist underlayer film-forming composition. Therefore, it is possible for the sulfonate according to the present invention having a nitrogen-containing base exhibiting a pKa of 6.5 to 9.5 to more effectively suppress the degeneration of the crosslinking agent in the resist underlayer film-forming composition than sulfonates having a nitrogen-containing base exhibiting a pKa of 6.5 or less.

(Storage Stability Test of Resist Underlayer Film-Forming Composition)

Storage stability test of epoxy resins was specifically conducted by the following method. The samples of Example 7 and Comparative Example 7 were stored at 35° C. for 3 weeks, and the change in weight average molecular weight Mw of the resist underlayer film before and after the storage stability test was determined by gel permeation chromatography (GPC), and the results were classified as "○" when the change was 5% or less, "Δ" when the change was from 6 to 19%, and "x" when the change was 20% or more. The results are shown in Table 3 below. That is, a larger change in weight average molecular weight Mw means a faster degeneration rate of epoxy groups in the resist underlayer film-forming composition, and a smaller change in weight average molecular weight Mw is desirable in the storage stability test.

TABLE 3

| | pKa of base in crosslinking catalyst | Change in weight average molecular weight before and after storage stability test |
|---|---|---|
| Example 7 | 7.40 | ○ |
| Comparative Example 7 | 5.25 | X |

Table 3 indicates that the change in weight average molecular weight of the resist underlayer film-forming composition of Example 7 before and after the storage stability test is lower than that of the resist underlayer film-forming composition of Comparative Example 7 before and after the storage stability test. That is, the crosslinking catalyst applied in Example 7 can effectively suppress the degeneration of the epoxy resin. Therefore, it is possible for the sulfonate according to the present invention having a nitrogen-containing base exhibiting a pKa of 6.5 to 9.5 to more effectively suppress the degeneration of the epoxy resin in the resist underlayer film-forming composition than sulfonates having a nitrogen-containing base exhibiting a pKa of 6.5 or less.

(Comparison of Curing Start Temperature of Resist Underlayer Film Using Each Crosslinking Catalyst)

Each of the resist underlayer film-forming compositions for lithography prepared in Examples 2 and Comparative Example 6 was applied to a silicon wafer, which is a semiconductor substrate, by a spinner. The silicon wafers were placed on a hot plate and baked at 80° C., 90° C., and 100° C. for 1 minute to form resist underlayer films of 25 nm to 35 nm thickness. These resist underlayer films were immersed in a mixed solvent of 70% by mass of propylene glycol monomethyl ether and 30% by mass of propylene glycol monomethyl ether acetate for 1 minute, and the change in coating film thickness before and after the immersion was defined as "○" when the change was 10% or less, "Δ" when the change was from 11 to 89%, and "x" when the change was 90% or more. The results are shown in Table 4 below.

TABLE 4

| Percentage of residual film at each temperature | | | | |
|---|---|---|---|---|
| Resist underlayer film | pKa of base in crosslinking catalyst | 80° C. | 90° C. | 100° C. |
| Example 2 | 7.40 | X | Δ | ○ |
| Comparative Example 6 | 10.06 | X | X | Δ |

It was confirmed that the curing was started by the resist underlayer film formed using the resist underlayer film-forming composition prepared in Example 2 at a lower temperature than the resist underlayer film formed using the resist underlayer film-forming composition prepared in Comparative Example 6.

(Measurement of Sublimate Amount)

The sublimate amount was measured using the sublimate measuring apparatus according to WO 2007/111147 A. First, each of the resist underlayer film-forming compositions prepared in Example 2 and Comparative Example 6 was applied to a 4-inch diameter silicon wafer substrate using a spin coater so as to have a film thickness of 30 nm. The wafers coated with each of the resist underlayer films were set in the sublimate measuring apparatus with an integrated hot plate, baked for 120 seconds, and the sublimates were collected on a quartz crystal microbalance (QCM) sensor, i.e., a quartz crystal unit with electrodes formed on it. The QCM sensor can measure minute changes in mass by utilizing the property that the frequency of a quartz crystal unit changes (drops) in proportion to its mass when a sublimate adheres to the surface (electrode) of the quartz crystal unit.

The detailed measurement procedure is as follows. The hot plate of the sublimate measuring apparatus was heated up to the baking temperature listed in Table 5, the pump flow rate was set to 1 $m^3/s$, and the apparatus was left for the first 60 seconds for stabilization. Immediately thereafter, the wafer coated with the resist underlayer film was promptly placed on the hot plate through the slide port, and sublimates at the period of time from 60 seconds to 180 seconds (120 seconds) were collected. The flow attachment (detection portion), which is the connection between the QCM sensor and the collection funnel of the sublimate measuring apparatus, is used without a nozzle, so that the airflow flows into the chamber unit through the flow path (aperture: 32 mm) with a distance of 30 mm from the sensor (quartz crystal unit) without being constricted. For the QCM sensor, a material mainly composed of silicon and aluminum (AlSi) was used as the electrode, with a quartz crystal unit diameter (sensor diameter) of 14 mm, an electrode diameter of 5 mm on the quartz crystal unit surface, and a resonant frequency of 9 MHz.

The obtained frequency changes were converted to grams from the eigenvalues of the quartz crystal unit used in the measurements to determine the relationship between the sublimate amount per wafer coated with the resist underlayer film and the lapse of time. The first 60 seconds is the time period when the apparatus is left for stabilization (wafer is not set), and the measured values from the 60-second point when the wafer is placed on the hot plate to the 180-second point are the measured values for the sublimate amount of the wafer. The sublimate amount of the resist underlayer film quantified with the apparatus is shown in Table 5 as a sublimate amount rate. The sublimate amount rate is expressed as a value normalized by taking the sublimate amount generated from the resist underlayer film of Comparative Example 1 as unity.

TABLE 5

| Sublimate amount generated from resist underlayer film | | | |
|---|---|---|---|
| Resist underlayer film | pKa of base in crosslinking catalyst | Firing temperature | Sublimate amount rate |
| Example 2 | 7.40 | 230° C. | 0.77 |
| Comparative Example 6 | 10.06 | 230° C. | 1.00 |

Table 5 indicates that the sublimate amount rate generated from the resist underlayer film-forming composition in Example 2 is less than the sublimate amount rate generated from the resist underlayer film-forming composition in Comparative Example 6. That is, the crosslinking catalyst used in Example 2 can effectively suppress the amount of sublimates generated. Therefore, it is possible for the sulfonates with nitrogen-containing bases exhibiting a pKa between 6.5 and 9.5 to form the resist underlayer film more quickly than sulfonates with nitrogen-containing bases exhibiting a pKa of 9.5 or more, thereby reducing the generation of sublimates and other substances.

INDUSTRIAL APPLICABILITY

In the above manner, it is possible for the resist underlayer film-forming composition of the present invention to suppress the degeneration of the crosslinking agent in the resist underlayer film-forming composition, thereby providing a high-quality resist underlayer film-forming composition with high storage stability.

The invention claimed is:

1. A resist underlayer film-forming composition comprising a crosslinkable resin, a crosslinking agent, a crosslinking catalyst represented by the following formula (I), and a solvent:

$$(A\text{-}SO_3)^-(BH)^+ \quad \text{(I)}$$

wherein A is a linear, branched, or cyclic saturated or unsaturated aliphatic hydrocarbon group which may be substituted, an aryl group which may be substituted with one or more groups other than hydroxy group, or a heteroaryl group which may be substituted, and B is a base having a pKa of 6.5 to 9.5, and is represented by $R^1R^2R^3N$, where $R^1$ and $R^2$ each independently represent a linear or branched, saturated or unsaturated aliphatic hydrocarbon group which may be substituted, $R^1$ and $R^2$ may form a ring with or without a heteroatom, $R^3$ represents an aromatic group which may be substituted, or a linear or branched, saturated or unsaturated aliphatic hydrocarbon group which may be substituted, and when $R^1$ and $R^2$ do not form a ring, $R^3$ is an aromatic group which may be substituted.

2. The resist underlayer film-forming composition according to claim 1, wherein the crosslinking agent is an aminoplast crosslinking agent or a phenoplast crosslinking agent.

3. The resist underlayer film-forming composition according to claim 2, wherein the aminoplast crosslinking agent is a highly alkylated, alkoxylated, or alkoxyalkylated melamine, benzoguanamine, glycol urea, urea, or a polymer thereof.

4. The resist underlayer film-forming composition according to claim 2, wherein the phenoplast crosslinking agent is a highly alkylated, alkoxylated, or alkoxyalkylated aromatic, or a polymer thereof.

5. The resist underlayer film-forming composition according to claim 1, wherein $R^3$ represents an aromatic group which may be substituted, or the following formula (II):

(II)

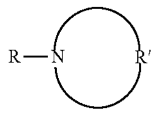

wherein R is a hydrogen atom, a nitro group, a cyano group, an amino group, a carboxyl group, a halogen atom, an alkoxy group having 1 to 10 carbon atoms, an alkyl group having 1 to 10 carbon atoms, an alkenyl group having 2 to 10 carbon atoms, an aryl group having 6 to 40 carbon atoms, an organic group containing an ether bond, an organic group containing a ketone bond, an organic group containing an ester bond, or a combination thereof, R' is represented by $$(R^a)_n—X—(R^b)—$$

where $R^a$ and $R^b$ each independently represent an optionally substituted alkylene, X is O, S, or $SO_2$, and n, and m are each independently 2, 3, 4, 5, or 6.

6. The resist underlayer film-forming composition according to claim 5, wherein $R^3$ represents a phenyl, naphthyl, anthracenyl, or phenanthrenyl group which may be substituted, R in formula (II) is a hydrogen atom, a methyl group, an ethyl group, an allyl group, or a cyanomethyl group, and R' in formula (II) is a base represented by $$(CH_2)_n—O—(CH_2)_m—.$$

7. The resist underlayer film-forming composition according to claim 1, further comprising an alcoholic hydroxy group-containing compound or a compound containing a group capable of forming one or more alcoholic hydroxy groups.

8. The resist underlayer film-forming composition according to claim 7, wherein the alcoholic hydroxy group-containing compound or a compound containing a group capable of forming one or more alcoholic hydroxy groups is a propylene glycol-based solvent, an oxyisobutyric acid ester-based solvent, or a butylene glycol-based solvent.

9. The resist underlayer film-forming composition according to claim 7, wherein the alcoholic hydroxy group-containing compound or a compound containing a group capable of forming one or more alcoholic hydroxy groups is propylene glycol monomethyl ether or methyl 2-hydroxy-2-methylpropionate.

10. The resist underlayer film-forming composition according to claim 1, wherein A in formula (I) is a methyl group, a fluoromethyl group, or a tolyl group.

11. The resist underlayer film-forming composition according to claim 1, wherein B in formula (I) is N-methylmorpholine or N,N-diethylaniline.

12. The resist underlayer film-forming composition according to claim 1, wherein the crosslinkable resin is at least one member selected from the group consisting of novolac resins, polyester resins, polyimide resins, and acrylic resins.

13. The resist underlayer film-forming composition according to claim 1, further comprising a surfactant.

14. A resist underlayer film-forming composition comprising an epoxy group-containing compound and/or an epoxy group-containing resin, a crosslinking catalyst represented by the following formula (I), and a solvent:

$$(A\text{-}SO_3)^-(BH)^+ \qquad (I)$$

wherein A is a linear, branched, or cyclic saturated or unsaturated aliphatic hydrocarbon group which may be substituted, an aryl group which may be substituted with one or more groups other than hydroxy group, or a heteroaryl group which may be substituted, and B is a base having a pKa of 6.5 to 9.5, and is represented by $R^1R^2R^3N$, where $R^1$ and $R^2$ each independently represent a linear or branched, saturated or unsaturated aliphatic hydrocarbon group which may be substituted, $R^1$ and $R^2$ may form a ring with or without a heteroatom, $R^3$ represents an aromatic group which may be substituted, or a linear or branched, saturated or unsaturated aliphatic hydrocarbon group which may be substituted, and when $R^1$ and $R^2$ do not form a ring, $R^3$ is an aromatic group which may be substituted.

15. A resist underlayer film obtained by applying the resist underlayer film-forming composition according to claim 1 to a semiconductor substrate, followed by baking.

16. A method for forming a resist pattern for use in the production of semiconductors, comprising the step of applying the resist underlayer film-forming composition according to claim 1 to a semiconductor substrate, followed by baking to form a resist underlayer film.

17. A method for producing a semiconductor device, comprising the steps of:

forming a resist underlayer film on a semiconductor substrate using the resist underlayer film-forming composition according to claim 1, forming a resist film thereon, forming a resist pattern by irradiation with a light or electron beam followed by development, etching the resist underlayer film using the formed resist pattern, and processing the semiconductor substrate using the patterned resist underlayer film.

18. A method for producing a semiconductor device, comprising the steps of:

forming a resist underlayer film on a semiconductor substrate using the resist underlayer film-forming composition according to claim 1, forming a hard mask thereon, forming a resist film thereon, forming a resist pattern by irradiation with a light or electron beam followed by development, etching the hard mask using the formed resist pattern, etching the resist underlayer film using the patterned hard mask, and processing the semiconductor substrate using the patterned resist underlayer film.

19. The production method according to claim 18, wherein the hard mask is formed by application or vapor deposition of an inorganic substance.

* * * * *